US012136458B2

(12) United States Patent
Nakagawa et al.

(10) Patent No.: US 12,136,458 B2
(45) Date of Patent: Nov. 5, 2024

(54) SEMICONDUCTOR MEMORY DEVICE

(71) Applicant: KIOXIA CORPORATION, Tokyo (JP)

(72) Inventors: Tomoki Nakagawa, Yokohama Kanagawa (JP); Koji Kato, Yokohama Kanagawa (JP); Shuhei Oketa, Yokohama Kanagawa (JP); Mai Shimizu, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 126 days.

(21) Appl. No.: 17/897,089

(22) Filed: Aug. 26, 2022

(65) Prior Publication Data
US 2023/0307051 A1 Sep. 28, 2023

(30) Foreign Application Priority Data

Mar. 24, 2022 (JP) .................................. 2022-047799

(51) Int. Cl.
G11C 7/10 (2006.01)
G11C 16/04 (2006.01)
G11C 16/08 (2006.01)

(52) U.S. Cl.
CPC .......... G11C 16/08 (2013.01); G11C 16/0483 (2013.01)

(58) Field of Classification Search
CPC ............................ G11C 16/08; G11C 16/0483
USPC .................................................... 365/189.05
See application file for complete search history.

(56) References Cited

U.S. PATENT DOCUMENTS

| 6,081,450 A * | 6/2000 | Nawaki | G11C 8/14 365/185.11 |
| 7,280,407 B2 * | 10/2007 | Umezawa | G11C 5/147 365/189.11 |
| 8,705,273 B2 * | 4/2014 | Kim | G11C 5/145 365/185.03 |
| 8,902,655 B2 * | 12/2014 | Shim | G11C 16/0483 365/189.11 |
| 9,530,505 B1 * | 12/2016 | Feng | G11C 16/14 |
| 9,941,015 B2 * | 4/2018 | Abe | G11C 16/32 |
| 10,811,099 B2 * | 10/2020 | Park | G11C 16/3459 |
| 11,574,686 B2 * | 2/2023 | Yamada | G11C 16/0483 |
| 11,621,039 B2 * | 4/2023 | Shibata | G11C 11/5642 365/185.28 |
| 2006/0023512 A1 | 2/2006 | Maejima et al. | |

(Continued)

FOREIGN PATENT DOCUMENTS

JP 4693375 B2 6/2011
JP 2012-203947 A 10/2012

*Primary Examiner* — Viet Q Nguyen
(74) *Attorney, Agent, or Firm* — Kim & Stewart LLP

(57) ABSTRACT

A semiconductor memory device includes a memory string, a voltage supply circuit, a plurality of control signal lines, a row decoder, and a control circuit. The voltage supply circuit is configured to generate a plurality of operation voltages to operate the semiconductor memory device. The operation voltages include a negative voltage. The plurality of control signal lines is connected between the voltage supply circuit and the memory string. The row decoder includes a plurality of transistors provided in the plurality of control signal lines, respectively. The control circuit is configured to control the transistors of the row decoder, and cause the negative voltage to be supplied to the row decoder during a certain period of time in which a voltage of one of the control signal lines drops to a negative level.

20 Claims, 24 Drawing Sheets

(56) References Cited

U.S. PATENT DOCUMENTS

2012/0243338 A1     9/2012   Nakamura
2016/0240264 A1*   8/2016   Hosono .............. G11C 16/3459

* cited by examiner

WL CROSS-SECTIONAL VIEW

SEMICONDUCTOR MEMORY DEVICE

CROSS-REFERENCE TO RELATED APPLICATION(S)

This application is based upon and claims the benefit of priority from Japanese Patent Application No. 2022-047799, filed Mar. 24, 2022, the entire contents of which are incorporated herein by reference.

FIELD

Embodiments described herein relate generally to a semiconductor memory device.

BACKGROUND

As one type of a semiconductor memory device, a NAND memory is known. There is a demand of improving reliability of an operation of the semiconductor memory device for high speed and multi-value processing.

DETAILED DESCRIPTION

Embodiments provide a semiconductor memory device with improved reliability in an operation of a row decoder.

In general, according to an embodiment, a semiconductor memory device includes a memory string, a voltage supply circuit, a plurality of control signal lines, a row decoder, and a control circuit. The voltage supply circuit is configured to generate a plurality of operation voltages to operate the semiconductor memory device. The operation voltages includes a negative voltage. The plurality of control signal lines is connected between the voltage supply circuit and the memory string. The row decoder includes a plurality of transistors provided in the plurality of control signal lines, respectively. The control circuit is configured to control the transistors of the row decoder, and cause the negative voltage to be supplied to the row decoder during a certain period of time in which a voltage of one of the control signal lines drops to a negative level.

Hereinafter, embodiments will be described in detail with reference to the drawings.

First Embodiment

In a first embodiment, occurrence of junction forward in a transistor configuring a switch in a row decoder is prevented to improve reliability of an operation of the row decoder. The junction forward typically occurs when a voltage of a control signal line such as a word line unintentionally swings to the negative side (hereinafter, also referred to as "negative swing") due to influence of capacitive coupling in response to a decrease in voltage in an adjacent wiring such that a predetermined negative voltage is supplied to the transistor.

(Configuration of Memory System)

Figure 1:
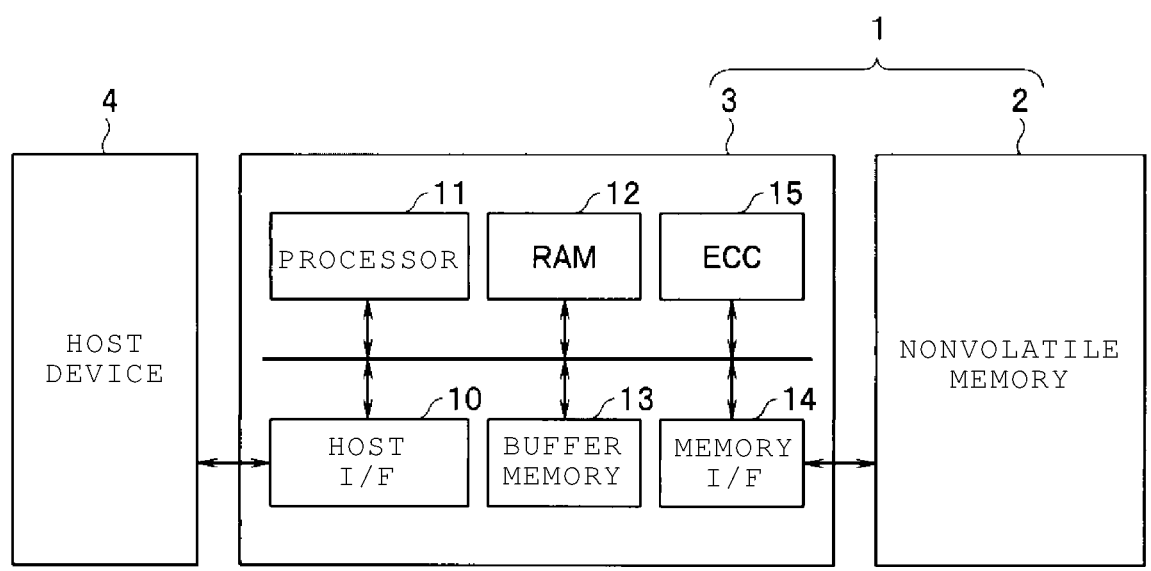
FIG. 1 is a block diagram illustrating a configuration example of a memory system according to a first embodiment.

FIG. 1 is a block diagram illustrating a configuration example of a memory system according to the first embodiment. A memory system 1 according to the first embodiment includes a memory controller 3 and a nonvolatile memory 2. The nonvolatile memory 2 may include a plurality of memory chips. The memory system 1 can be connected to a host device 4. The host device 4 is, for example, an electronic apparatus such as a personal computer or a mobile terminal.

The memory system 1 may have a configuration in which a plurality of chips configuring the memory system 1 are mounted on a motherboard on which the host device 4 is mounted, or may be configured as a system large-scale integrated circuit (LSI) or a system-on-a-chip (SoC) where the memory system 1 is implemented with one module. Examples of the memory system 1 include a memory card such as an SD card, a solid-state-drive (SSD), and an embedded-multi-media-card (eMMC).

The nonvolatile memory 2 is a NAND memory including a plurality of memory cells and stores data in a nonvolatile manner. A specific configuration of the nonvolatile memory 2 will be described below.

The memory controller 3 commands to write (also referred to as "program"), read, or erase data into or from the nonvolatile memory 2, for example, in response to a command from the host device 4. In addition, the memory controller 3 manages a memory space of the nonvolatile memory 2. The memory controller 3 includes a host interface (host I/F) circuit 10, a processor 11, a random-access memory (RAM) 12, a buffer memory 13, a memory interface circuit (memory I/F) circuit 14, and an error checking and correcting (ECC) circuit 15.

The host I/F circuit 10 is connected to the host device 4 via a host bus and executes interface processing with the host device 4. In addition, the host I/F circuit 10 transmits and receives a command, an address, and data to and from the host device 4.

The processor 11 is configured with, for example, a central processing unit (CPU). The processor 11 controls an overall operation of the memory controller 3. For example, when a write instruction is received from the host device 4, the processor 11 issues a write command corresponding to the write instruction from the host device 4 to the nonvolatile memory 2 via the memory I/F circuit 14. The same is applicable to the read command and the erase command. In addition, the processor 11 executes various processes such as wear leveling for managing the nonvolatile memory 2.

The RAM 12 is used as a work area of the processor 11 and stores, for example, firmware data loaded from the nonvolatile memory 2 or various tables generated by the processor 11. The RAM 12 is configured with, for example, a DRAM or an SRAM.

The buffer memory 13 temporarily stores data transmitted from the host device 4, and temporarily stores data transmitted from the nonvolatile memory 2.

The memory I/F circuit 14 is connected to the nonvolatile memory 2 via a bus, and executes interface processing with the nonvolatile memory 2. In addition, the memory I/F circuit 14 transmits and receives a command, an address, and data to and from the nonvolatile memory 2.

When data (may be referred to as write data) is written, the ECC circuit 15 generates an error-correcting code for the write data, adds the error-correcting code to the write data, and transmits the data to the memory I/F circuit 14. In addition, when the data is read, the ECC circuit 15 executes error detection and/or error correction on the read data using the error-correcting code in the read data. The ECC circuit 15 may be provided in the memory I/F circuit 14.

(Configuration of Nonvolatile Memory)

Figure 2:
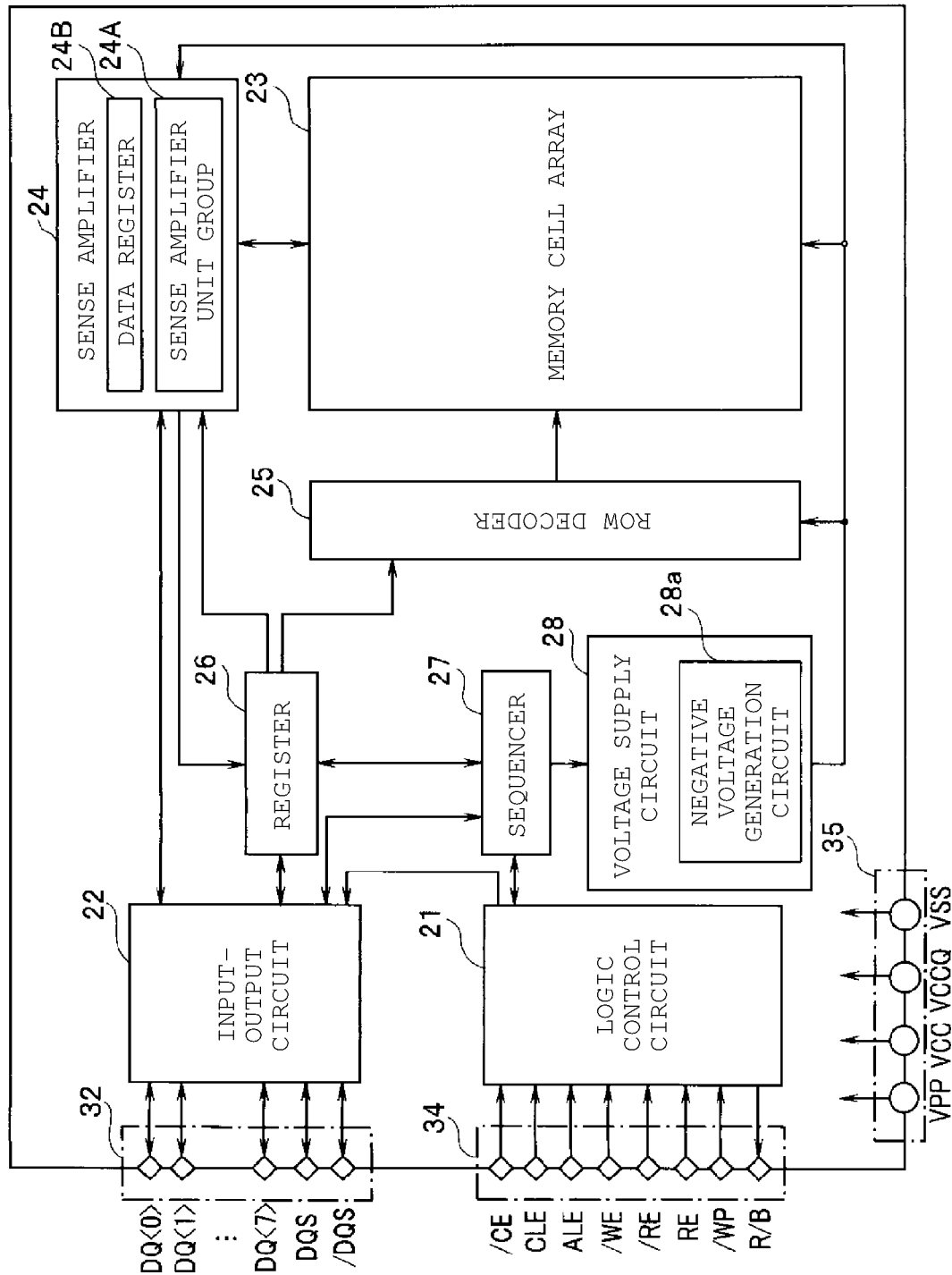
FIG. 2 is a block diagram illustrating an example of a nonvolatile memory in FIG. 1.

FIG. 2 is a block diagram illustrating an example of the nonvolatile memory 2 in FIG. 1. The nonvolatile memory 2 includes a logic control circuit 21, an input-output circuit 22, a memory cell array 23, a sense amplifier 24, a row decoder 25, a register 26, a sequencer 27, a voltage supply circuit 28, an input-output pad group 32, a logic control pad group 34, and a power input terminal group 35.

The memory cell array 23 includes a plurality of blocks BLK. Each of the blocks BLK includes a plurality of memory cell transistors (may be referred to as memory cells). In the memory cell array 23, a plurality of bit lines, a plurality of word lines, a source line, and the like are provided in order to control voltages that are applied to the memory cell transistors. A specific configuration of the block BLK will be described below.

In order to transmit and receive respective signals including data to and from the memory controller 3, the input-output pad group 32 includes a plurality of terminals (e.g., pads) corresponding to a signal DQ<7:0> and data strobe signals DQS and /DQS.

In order to transmit and receive respective signals to and from the memory controller 3, the logic control pad group 34 includes a plurality of terminals (e.g., pads) corresponding to a chip enable signal /CE, a command latch enable signal CLE, an address latch enable signal ALE, a write enable signal /WE, read enable signals RE and /RE, and a write-protect signal /WP.

The signal /CE enables selection of the nonvolatile memory 2. The signal CLE can latch a command to be transmitted as the signal DQ in a command register. The signal ALE can latch an address to be transmitted as the signal DQ in an address register. The signal WE enables writing. The signal RE enables reading. The signal WP prohibits writing and erasing. The signal R/B represents whether the nonvolatile memory 2 is in a ready state (i.e., state where the nonvolatile memory 2 can receive a command from an external apparatus) or in a busy state (i.e., state where the nonvolatile memory 2 cannot receive a command from an external apparatus). The memory controller 3 can recognize the state of the nonvolatile memory 2 by receiving the signal R/B.

In order to supply various operating voltages to the nonvolatile memory 2 from external apparatuses, the power input terminal group 35 includes a plurality of terminals for inputting power supply voltages VCC, VCCQ, and VPP and a ground voltage VSS. The power supply voltage VCC is a circuit power supply voltage that is generally supplied from an external apparatus as an operating voltage. For example, a voltage of about 3.3 V is input. As the power supply voltage VCCQ, for example, a voltage of 1.2 V is input. The power supply voltage VCCQ is used when signals are transmitted and received between the memory controller 3 and the nonvolatile memory 2.

The power supply voltage VPP is higher than the power supply voltage VCC. For example, a voltage of 12 V is input. When data is written into or erased from the memory cell array 23, a high voltage of about 20 V is required. At this time, when the power supply voltage VPP of about 12 V is boosted by a booster circuit of the voltage supply circuit 28, a desired voltage can be generated with higher speed and lower power consumption as compared to a case where the power supply voltage VCC of about 3.3 V is boosted. The power supply voltage VCC is a standard power supply voltage that is supplied to the nonvolatile memory 2, and the power supply voltage VPP is an additional power supply voltage that is optionally supplied, for example, depending on a usage environment.

The logic control circuit 21 and the input-output circuit 22 are connected to the memory controller 3 via a NAND bus. The input-output circuit 22 transmits and receives the signals DQ (for example, DQ0 to DQ7) to and from the memory controller 3 via the NAND bus.

The logic control circuit 21 receives external control signals (for example, the chip enable signal /CE, the command latch enable signal CLE, the address latch enable signal ALE, the write enable signal /WE, the read enable signals RE and /RE, and the write-protect signal /WP) from the memory controller 3 via the NAND bus. In addition, the logic control circuit 21 transmits the ready/busy signal R/B to the memory controller 3 via the NAND bus.

The input-output circuit 22 transmits and receives the signal DQ<7:0> and the data strobe signals DQS and /DQS to and from the memory controller 3. The input-output circuit 22 transfers a command and an address in the signal DQ<7:0> to the register 26. In addition, the input-output circuit 22 transmits and receives write data and read data to and from the sense amplifier 24.

The register 26 includes a command register, an address register, and a status register. The command register temporarily stores a command. The address register temporarily stores an address. The status register temporarily stores data required for the operation of the nonvolatile memory 2. The register 26 is configured with, for example, SRAM.

The sequencer 27 receives a command from the register 26 and controls the nonvolatile memory 2 in accordance with a sequence based on this command.

The voltage supply circuit 28 is controlled by the sequencer 27 to receive a power supply voltage from the outside of the nonvolatile memory 2 and to generate a plurality of voltages required for a write operation, a read operation, and an erasing operation using the received power supply voltage. In the present embodiment, the voltage supply circuit 28 includes a negative voltage generation circuit 28a. The negative voltage generation circuit 28a converts the ground voltage VSS input through the power input terminal group 35a into a negative voltage VBB. This negative voltage VBB is used in, for example, a block decoder 25B described below.

The row decoder 25 receives a row address from the register 26 and decodes the received row address. The row decoder 25 executes a selection operation of selecting a word line based on the decoded row address. The row decoder 25 transfers a plurality of voltages required for a write operation, a read operation, and an erasing operation to the selected block.

The sense amplifier 24 receives a column address from the register 26 and decodes the received column address. The sense amplifier 24 includes a sense amplifier unit group 24A and a data register 24B. The sense amplifier unit group 24A is connected to each of bit lines and selects any one from the bit lines based on the decoded column address. In addition, the sense amplifier unit group 24A detects and amplifies data read from the memory cell transistor to the bit line when the data is read. In addition, the sense amplifier unit group 24A transfers write data to the bit line when the data is written.

When the data is read, the data register 24B temporarily stores the data detected by the sense amplifier unit group 24A and serially transfers the data to the input-output circuit 22. In addition, when data is written, the data register 24B temporarily stores the data that is serially transferred from the input-output circuit 22 and transfers the data to the sense amplifier unit group 24A. The data register 24B is configured with, for example, SRAM.

(Block Configuration of Memory Cell Array)

Figure 3:
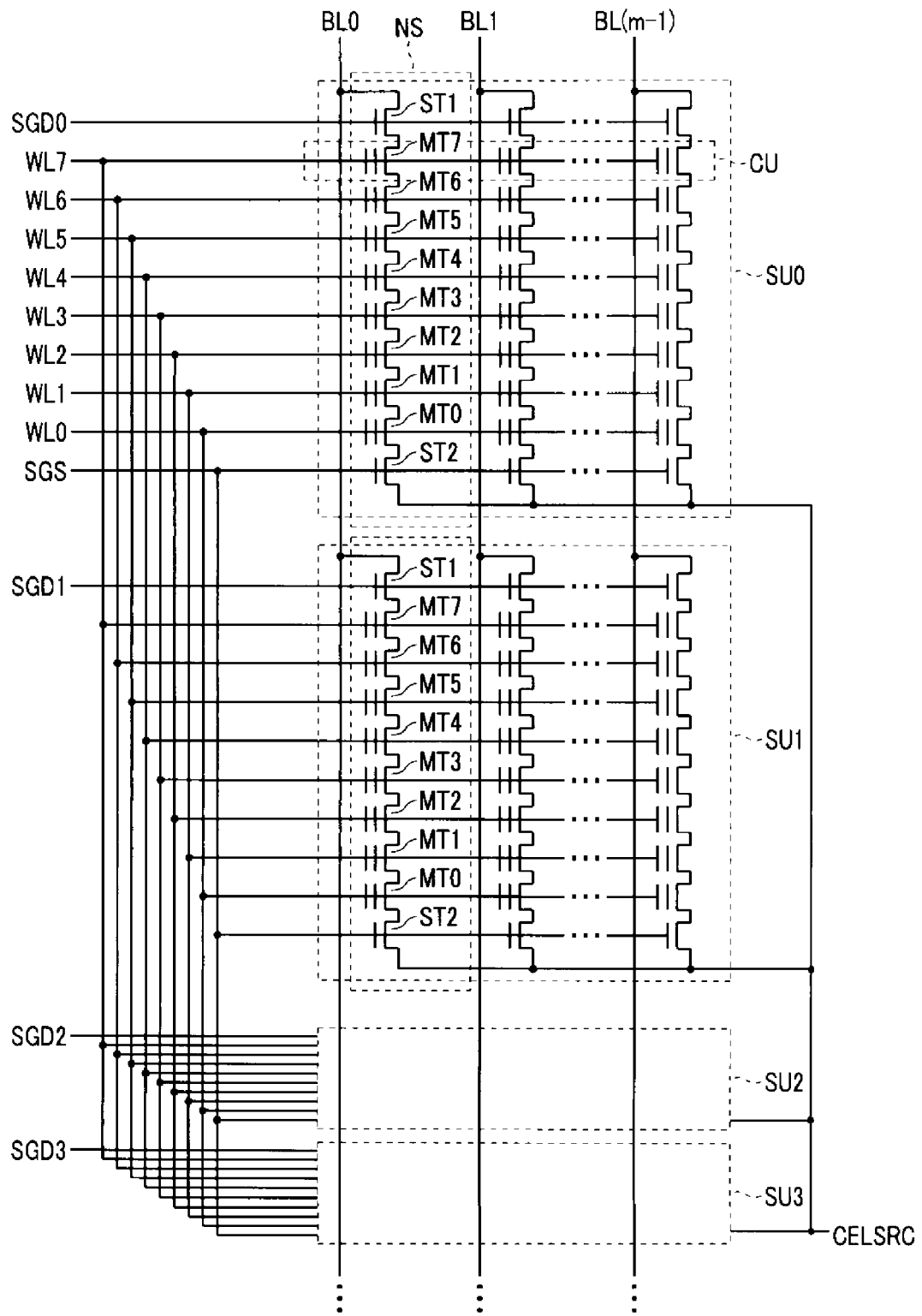
FIG. 3 is a circuit diagram illustrating a configuration example of a block of a memory cell array having a three-dimensional structure.

FIG. 3 is a diagram illustrating a configuration example of a block of the memory cell array 23 having a three-dimensional structure. FIG. 3 illustrates one block BLK among a plurality of blocks configuring the memory cell array 23. Other blocks of the memory cell array 23 have the same configuration as that of FIG. 3.

As illustrated in FIG. 3, the block BLK includes, for example, four string units SU0 to SU3 (hereinafter, representatively referred to as "string units SU"). In addition, each of the string units SU includes a NAND string NS including a plurality of memory cell transistors MT (MT0 to MT7) and select gate transistors ST1 and ST2. Here, the number of memory cell transistors MT in the NAND string NS is 8 in FIG. 3, but may be more than 8. The select gate transistors ST1 and ST2 are illustrated as one transistor on the electric circuit and may have the same structure as that of the memory cell transistor. In addition, a plurality of select gate transistors may be used as the select gate transistors ST1 and ST2. Further, a dummy cell transistor may be provided between the memory cell transistors MT and the select gate transistors ST1 and ST2.

The memory cell transistors MT are located between the select gate transistors ST1 and ST2 such that the transistors are connected in series. A memory cell transistor MT7 on a first end side (i.e., bit line side) is connected to the select gate transistor ST1, and a memory cell transistor MT0 on a second end side (i.e., source line side) is connected to the select gate transistor ST2.

Gates of the respective select gate transistors ST1 of the string units SU0 to SU3 are connected to select gate lines SGD0 to SGD3 (hereinafter, representatively referred to as "select gate lines SGD"), respectively. Gates of the select gate transistors ST2 in each of the string units SU0 to SU3 may be connected in common to a select gate line SGS. Gates of the plurality of select gate transistors ST2 in each of the blocks BLK may be connected to select gate lines SGS0 to SGS3 (hereinafter, representatively referred to as "select gate lines SGS").

Gates of the memory cell transistors MT0 to MT7 in the same block BLK are connected in common to word lines WL0 to WL7, respectively. That is, the word lines WL0 to WL7 are connected in common between the plurality of string units SU0 to SU3 in the same block BLK. On the other hand, the select gate lines SGD are independent from each other for each of the string units SU0 to SU3 even in the same block BLK. Gates of memory cell transistors MTi on the same line in the block BLK are connected to the same word line WLi.

Each of the NAND strings NS is connected to the corresponding bit line. Accordingly, each of the memory cell transistors MT is connected to the bit line through the select gate transistors ST1 and ST2 in the NAND string NS or another memory cell transistor MT. In general, data of the memory cell transistors MT in the same block BLK is collectively erased. On the other hand, typically, reading and writing of data are collectively executed on a plurality of memory cell transistors MT that are connected in common to one word line WL provided in one string unit SU. This set including memory cell transistors MT that share the word line WL in one string unit SU will be referred to as "cell unit CU".

That is, the write operation and the read operation on the cell unit CU are executed in units of one page. For example, when each of the cells is a triple level cell (TLC) capable of storing 3-bit (octal) data, one cell unit CU can store data corresponding three pages. Three bits that can be stored in each of the memory cell transistors MT correspond to the three pages.

The states of the select gate transistors ST1 and ST2 are controlled by the select gate lines SGD and SGS, and the states of the memory cell transistors MT0 to MT7 are controlled by the word lines WL0 to WL7. Therefore, the select gate lines SGD and SGS and the word lines WL will also be referred to as "control signal lines".

(Cross-Sectional Structure of Nonvolatile Memory)

Figure 4:
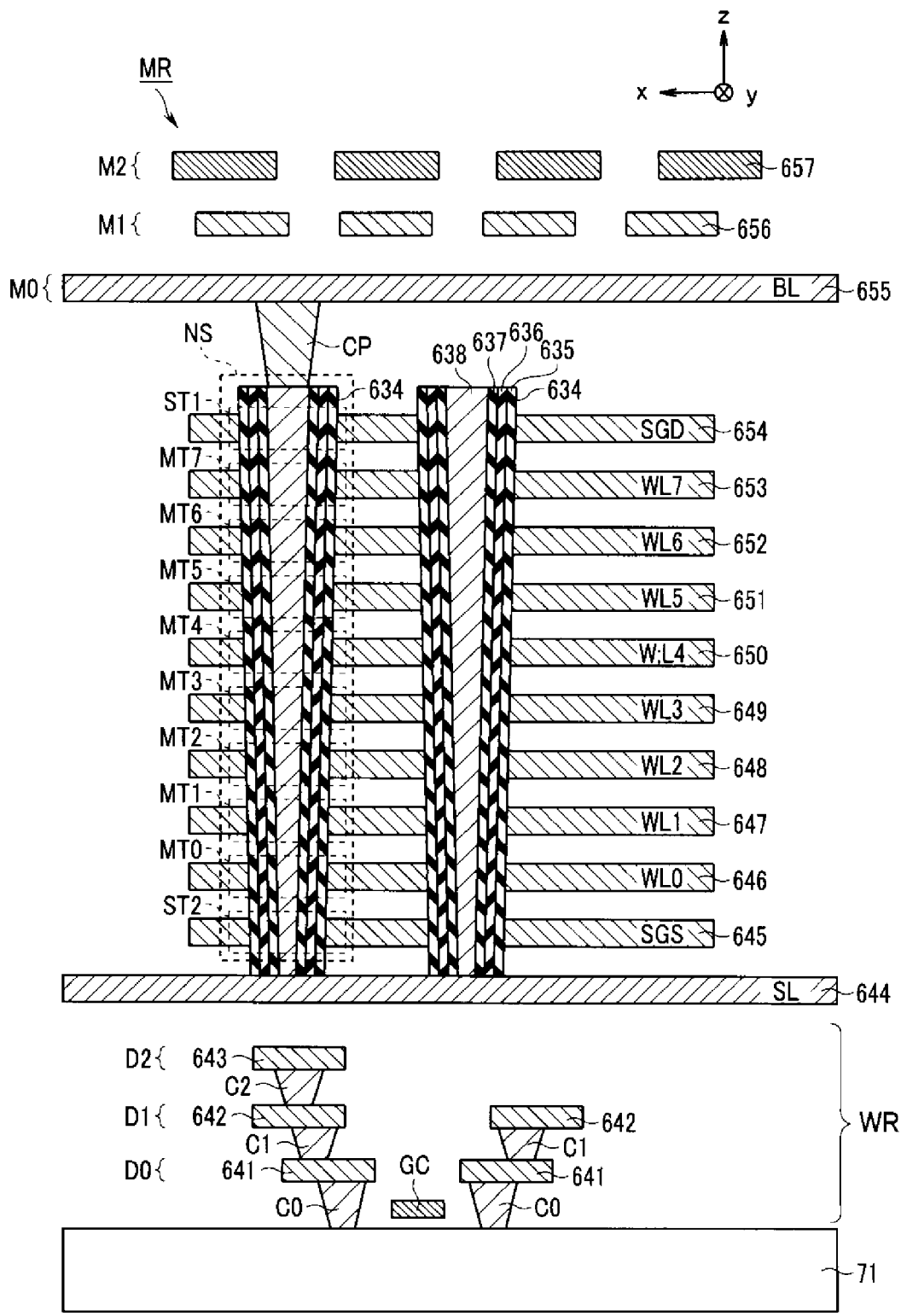
FIG. 4 is a cross-sectional diagram illustrating a partial region of a semiconductor memory device according to an embodiment.

FIG. 4 is a cross-sectional diagram illustrating a partial region of a semiconductor memory device according to the present embodiment. FIG. 4 illustrates an example in which a peripheral circuit region corresponding to a peripheral circuit such as the sense amplifier 24 or the row decoder 25 is provided on a semiconductor substrate 71 and a memory region is provided over the peripheral circuit region. In the following description, it is assumed that two directions parallel to a surface of the semiconductor substrate 71 and perpendicular to each other are an x direction and a y direction and a direction perpendicular to the surface of the semiconductor substrate 71 is a z direction.

As illustrated in FIG. 4, a nonvolatile memory in a memory region MR includes the semiconductor substrate 71, conductors 641 to 657, memory pillars 634, and contact plugs C0, C1, C2, and CP. In the drawings described below, a p-type or n-type well region that is formed on an upper surface portion of the semiconductor substrate 71, an impurity diffusion region that is formed in each of the well regions, and a gate insulating film and an element isolation region that insulate the well regions from each other are not illustrated.

In the memory region MR, a conductor GC is provided on the semiconductor substrate 71 via a gate insulating film (not illustrated). In addition, in a plurality of impurity diffusion regions (not illustrated) that are provided on the semiconductor substrate 71 such that the conductor GC is interposed therebetween, for example, a plurality of contacts C0 are provided, respectively. The memory cell array 23 is located on the semiconductor substrate 71 through a wiring layer region WR.

A conductor 641 that forms a wiring pattern is provided on each of the contacts C0. For example, the conductor GC functions as a gate electrode of a transistor, and the conductor 641 functions as a source electrode or a drain electrode of a transistor.

For example, a contact C1 is provided on each of the conductors 641. For example, a conductor 642 is provided on each of the contacts C1. For example, a contact C2 is provided on each of the conductors 642. For example, a conductor 643 is provided on the contact C2.

Each of the wiring patterns of the conductors 641, 642, and 643 is provided in the wiring layer region WR between the sense amplifier 24 and the memory cell array 23. Hereinafter, wiring layers where the conductors 641, 642, and 643 are provided will be referred to as wiring layers D0, D1, and D2, respectively. The wiring layers D0, D1, and D2 are provided in a lower layer portion of the nonvolatile memory 2. Here, three wiring layers are provided in the wiring layer region WR. However, two or less wiring layers or four or more wiring layers may be provided in the wiring layer region WR.

For example, a conductor 644 is provided over the conductor 643, for example, through an interlayer insulating film. The conductor 644 is formed in a plate shape parallel to an xy plane and functions as a source line CELSRC. For example, conductors 645 to 654 respectively corresponding to the NAND strings NS are stacked in this order over the conductor 644. An interlayer insulating film (not illustrated) is provided between conductors adjacent to each other in the z direction among the conductors.

Each of the conductors 645 to 654 is formed, for example, in a plate shape parallel to the xy plane. For example, the conductor 645 functions as the select gate lines SGS, the conductors 646 to 653 function as the word lines WL0 to WL7, respectively, and the conductor 654 functions as the select gate line SGD.

The memory pillars 634 have a pillar shape, penetrate through the conductors 645 to 654, respectively, and come into contact with the conductor 644. The memory pillar 634 includes, for example, a pillar-shaped semiconductor layer (may be referred to as a semiconductor pillar) 638 that is provided on the center side, a tunnel insulating film 637 that is formed outside the semiconductor layer 638, a charge storage film 636 that is formed outside the tunnel insulating film 637, and a block insulating film 635 that is formed outside the charge storage film 636.

For example, a portion where the memory pillar 634 and the conductor 645 intersect with each other functions as the select transistor ST2. A portion where the memory pillar 634 and each of the conductors 646 to 653 intersect with each other functions as a memory cell transistor (memory cell) MT. A portion where the memory pillar 634 and the conductor 654 intersect with each other functions as the select transistor ST1.

A conductor 655 is provided in a layer over the upper surface of the memory pillar 634 with an interlayer insulating film therebetween. The conductor 655 is formed in a linear shape extending in the x direction and corresponds to a bit line BL. A plurality of conductors 655 are located at intervals in the y direction (not illustrated). The conductor 655 is electrically connected to the semiconductor layer 638 in one memory pillar 634 corresponding to the string unit SU.

Specifically, in each of the string units SU, for example, a contact plug CP is provided on the semiconductor layer 638 in each of the memory pillars 634, and one conductor 655 is provided on the contact plug CP. The embodiment is not limited to this configuration, the semiconductor layer 638 and the conductor 655 in the memory pillar 634 may be connected to each other through a plurality of contacts or wirings.

A conductor 656 is provided in a layer over the layer where the conductor 655 is provided through an interlayer insulating film. A conductor 657 is provided in a layer above the layer where the conductor 656 is provided through an interlayer insulating film.

The conductors 656 and 657 correspond to, for example, a wiring provided in the memory cell array 23 and a wiring for connection to a peripheral circuit provided below the memory cell array 23, respectively. The conductors 656 and 657 may be connected to each other through a pillar-shaped contact (not illustrated). Here, the layer where the conductor 655 is provided will be referred to as "wiring layer M0", the layer where the conductor 656 is provided will be referred to as "wiring layer M1", and the layer where the conductor 657 is provided will be referred to as "wiring layer M2".

As illustrated in FIG. 4, in the semiconductor memory device according to the present embodiment, wiring layers D0, D1, and D2 are formed in a layer below the string unit SU. In addition, the wiring layers M0, M1, and M2 are formed in a layer over the string unit SU. The wiring layers D0, D1, and D2 are, for example, tungsten wirings formed using a damascene method.

The wiring layer M2 is, for example, an aluminum wiring formed by anisotropic etching such as reactive ion etching (RIE). The wiring layer M2 has a large thickness and low resistance, and thus are assigned with main power supply wirings (VCC, VSS). The wiring layer M1 is, for example, a copper (Cu) wiring formed using a damascene method. The Cu wiring has high wiring reliability such as electromigration (EM) resistance. Therefore, the wiring layer M1 is employed for a signal line where data is required to be transmitted with reliability. The wiring layer M0 is, for example, a Cu wiring formed using a damascene method. The wiring layer M0 is employed for a bit line BL, as well as a part of the main power supply wirings for power reinforcement. It is preferable that a wiring such as a signal line other than the main power supply wirings has as low resistance as possible. Therefore, this wiring is formed using a wiring layer (for example, the wiring layer M2) that is positioned as high as possible.

(Threshold Voltage Distribution and Coding)

Figure 5:
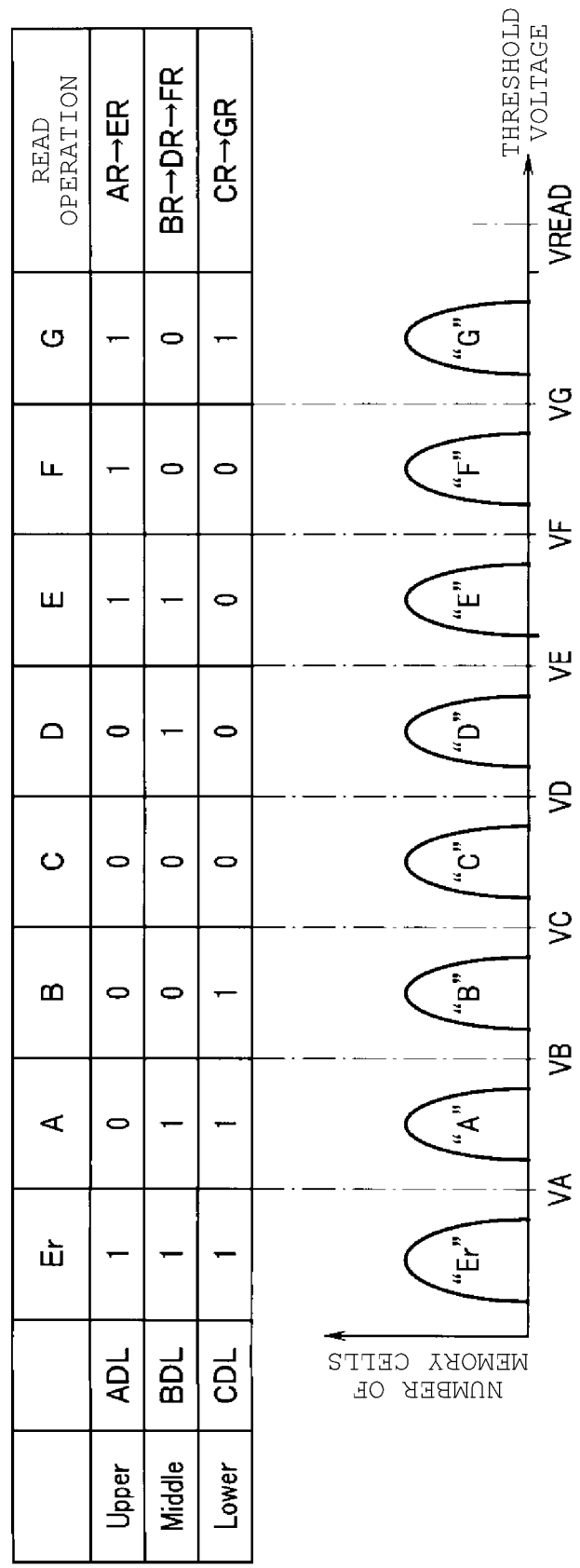
FIG. 5 is a diagram illustrating a threshold voltage distribution and coding of the memory cell array.

FIG. 5 is a diagram illustrating a threshold voltage distribution and coding of the memory cell array. FIG. 5 illustrates a threshold voltage distribution example of the 3 bit/cell nonvolatile memory 2. In the nonvolatile memory 2, a threshold voltage of the memory cell transistor MT is set depending on each of data values of multi-valued data stored in the memory cell transistor MT. The amount of charge injected into the charge storage film 636 (charge storage region) is stochastic. For that reason, as illustrated in FIG. 5, the threshold voltages of the memory cell transistors MT are also statistically distributed.

In FIG. 5, the threshold voltage is represented in the horizontal direction, the number of memory cells (the number of cells) is represented in the vertical direction, and the distribution of the threshold voltages (threshold voltage distribution) are represented by eight lobe-shaped regions Er, A, B, C, D, E, F, and G. The regions will be referred to as "Er state", "A state", "B State", "C state", "D state", "E state", "F state", and "G state", respectively. In the example of FIG. 5, by setting the threshold voltage of the memory cell transistor MT to any one of the eight states, Octal data (i.e., three-bit data) can be stored in the memory cell transistor MT.

Voltages VA, VB, VC, VD, VE, VF, and VG are reference voltages used as boundaries of the states. In the read operation, data can be read by applying the voltages VA to VG to the word lines WL as read voltages for reading and determining whether to turn on or off the target memory cell transistor MT. The low read voltages such as the voltage VA or VB may be a negative voltage.

As a method of coding for correlating the data values with the states (i.e., the threshold voltage distribution) of the memory cell transistor MT, various methods may be employed. The upper section of FIG. 5 illustrates 2-3-2 coding as an example of the coding.

In the example of FIG. 5, the memory cell transistor of the Er state stores data (1,1,1), the memory cell transistor of the A state stores data (0,1,1), the memory cell transistor of the B state stores data (0,0,1), the memory cell transistor of the C state stores data (0,0,0), the memory cell transistor of the D state stores data (0,1,0), the memory cell transistor of the E state stores data (1,1,0), the memory cell transistor of the F state stores data (1,0,0), and the memory cell transistor of the G state stores data (1,0,1).

A data group by the upper bit of each of the memory cell transistors, a data group by the middle bit, and a data group by the lower bit will be referred to as "upper page", "middle page", and "lower page", respectively. In general, data is read in units of one page.

If whether data stored in each of the memory cell transistors is any value of three bits is determined for reading instead of reading in units of one page, it is necessary to change the read voltage to be applied to a selected word line WL seven times from the voltage VA to the voltage VG. On the other hand, when data is read in units of one page, the data can be read by changing the voltage two or three times. AR, BR, CR, DR, ER, FR, and GR of FIG. 5 represent application of the read voltages VA, VB, VC, VD, VE, VF, and VG for reading, respectively.

For example, when the value of the lower page of each of the memory cell transistors is read, the read voltage may be changed twice to the voltage VA and the voltage VE. For example, during the application of the read voltage VA to the selected word line WL for reading (AR in FIG. 5), when a memory cell transistor to be read by the sense amplifier unit group 24A is in a conductive state, it can be determined that the lower page of the memory cell transistor to be read is "1".

In addition, for example, during the application of the read voltage VA to the selected word line WL for reading (AR), when a memory cell transistor to be read by the sense amplifier unit group 24A is in a non-conductive state, the lower page of the memory cell transistor to be read may be "0" or "1". Accordingly, subsequently, the read voltage VE is applied for reading (ER). As a result, when the memory cell transistor to be read by the sense amplifier unit group 24A is in a conductive state, it can be determined that the lower page of the memory cell transistor is "0". When the memory cell transistor to be read by the sense amplifier unit group 24A is in a non-conductive state, it can be determined that the lower page of the memory cell transistor is "1".

In this way, in the 2-3-2 coding of FIG. 5, data can be read by changing the read voltage twice in the upper page, three times in the middle page, and twice in the lower page at a maximum. In the coding illustrated in FIG. 5, a grey code is used in which data changes by one bit between two adjacent regions.

(Configuration of Row Decoder)

Figure 6:
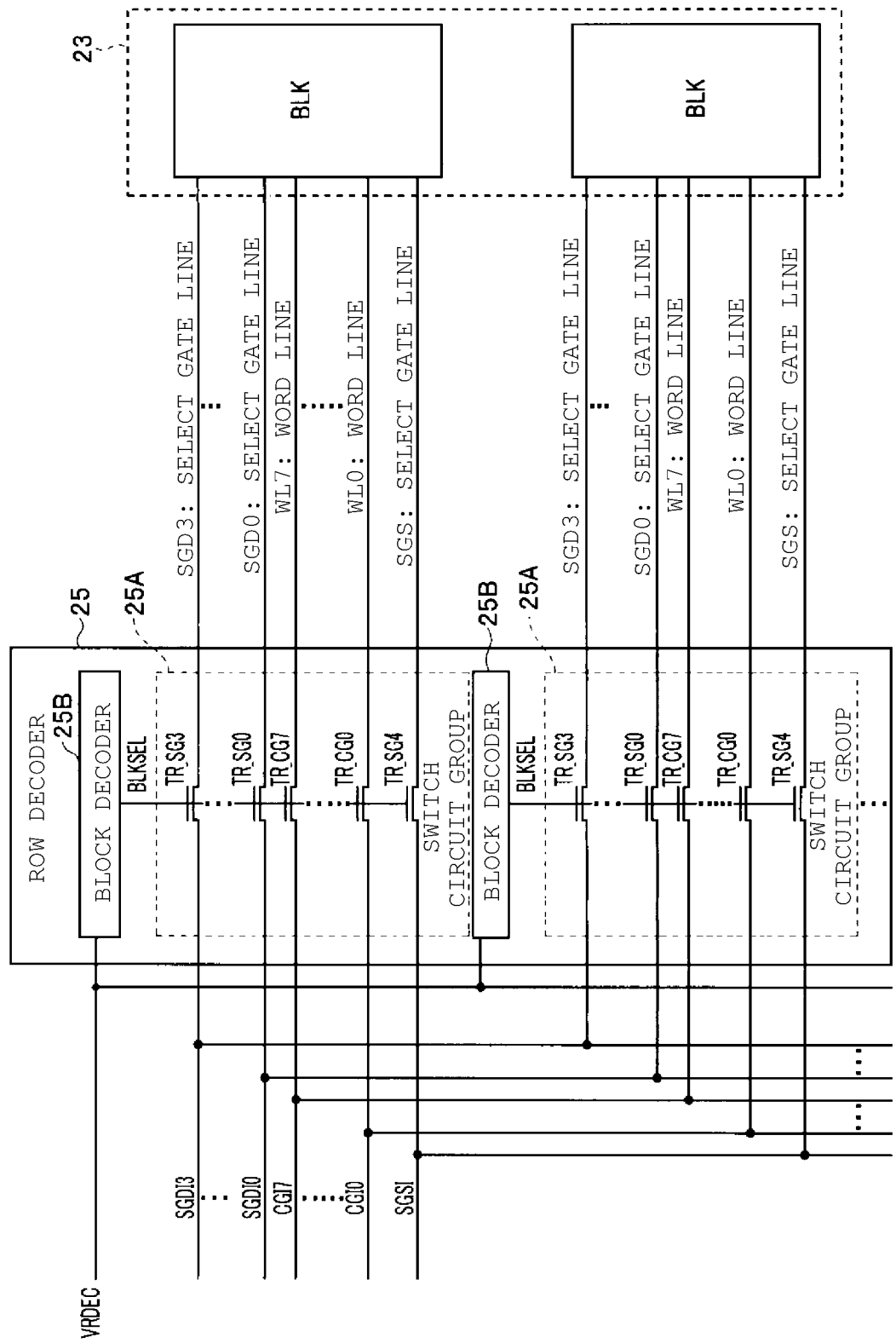
FIG. 6 is a block diagram illustrating an example of a row decoder in FIG. 2.

FIG. 6 is a block diagram illustrating an example of the row decoder 25 in FIG. 2. FIG. 6 illustrates only a circuit for a block BLK0 and a circuit for a block BLK1 in the row decoder 25. Circuits for other blocks have the same circuit configuration as the above circuits.

Various voltages are supplied from the voltage supply circuit 28 to the row decoder 25 through a control signal line SGSI, control signal lines CGI0 to CGI7 (hereinafter, representatively referred to as "control signal lines CGI"), and control signal lines SGDI0 to SGDI3 (hereinafter, representatively referred to as "control signal lines SGDI"). The voltage supply circuit 28 generates various voltages required for a write operation, a read operation, and an erasing operation. In addition, the voltage supply circuit 28 generates a program voltage VPGM, and generates a voltage VPGMH higher than the program voltage VPGM. In addition, the negative voltage generation circuit 28a of the voltage supply circuit 28 converts the ground voltage VSS into the negative voltage VBB. FIG. 6 illustrates only the single control signal line SGSI. Alternatively, a plurality of control signal lines SGSI may be adopted.

The control signal lines SGSI, SGDI, and CGI are branched at the row decoder 25 and connected to wirings of each of the blocks BLK. That is, the control signal lines SGDI0 to SGDI3 function as global drain-side select gate lines and are connected to the select gate lines SGD0 to SGD3 as local control signal lines of the blocks BLK through the row decoder 25. The control signal lines CGI0 to CGI7 function as global word lines, and are connected to the word lines WL0 to WL7 as local control signal lines of the blocks BLK through the row decoder 25. The signal line SGSI functions as a global source-side select gate line and is connected to the select gate lines SGS as local control signal lines of the blocks BLK through the row decoder 25.

When the plurality of select gate lines SGS0, SGS1, and . . . are adopted, control signal line SGSI0, SGSI1, . . . (hereinafter, these control signal lines will be representatively referred to as "control signal lines SGSI") corresponding thereto are provided.

The voltage supply circuit 28 is controlled by the sequencer 27 to supply various generated voltages to the corresponding signal lines SGDI0 to SGDI3, SGSI, and CGI0 to CGI7, respectively. For example, during the read operation, the voltage supply circuit 28 selects and supplies voltages such as a read voltage VCGRV, a voltage VREAD, a voltage VEADL, and a voltage VREADK to the corresponding word lines WL depending on targets (i.e., row addresses) of the operation.

The row decoder 25 includes: a plurality of switch circuit groups 25A corresponding to the respective blocks; and a plurality of block decoders 25B provided corresponding to the plurality of switch circuit groups 25A, respectively. Each of the switch circuit groups 25A includes: a plurality of transistors TR_SG0 to TR_SG3 connected to the signal lines SGDI0 to SGDI3 and the select gate line SGD0 to SGD3, respectively; a plurality of transistors TR_CG0 to TR_CG7 connected to the signal lines CGI0 to CGI7 and the word lines WL0 to WL7, respectively; and a transistor TR_SG4 connected to the signal line SGSI and the select gate lines SGS. Each of the transistors TR_SG0 to TR_SG4 and the transistors TR_CG0 to TR_CG7 (hereinafter, when it is not necessary to distinguish between these transistors, these transistors will be referred to as "transistors TR") has a high breakdown voltage.

When each of the block decoders 25B itself is designated by the row address, a block selection signal BLKSEL is supplied to gates of the transistors TR_SG0 to TR_SG4 and the transistors TR_CG0 to TR_CG7 (e.g., during the write operation, the voltage VPGMH). As a result, in the switch circuit group 25A to which the block selection signal BLKSEL is supplied from the block decoder 25B designated by the row address, the transistors TR_SG0 to TR_SG4 and the transistors TR_CG0 to TR_CG7 enter an ON state and go into a conductive state. Therefore, the voltages supplied from the voltage supply circuit 28 to the signal lines SGDI0 to SGDI3, the signal line SGSI, and the signal lines CGI0 to CGI7 are supplied to the select gate line SGD0 to SGD3 and SGS and the word lines WL0 to WL7 in the block BLK as an operation target.

(Write Operation)

When data is written into the memory cell transistor MT, a threshold voltage of the memory cell transistor MT is set to a value corresponding to the values of the data. When the program voltage VPGM is applied to the word line WL and a predetermined voltage (e.g., VSS) is applied to the bit line, electrons are injected into the charge storage film 636 such that the threshold voltage increases. By increasing the program voltage VPGM, the amount of electrons injected increases such that the threshold voltage of the memory cell transistor MT can increase. However, due to a fluctuation or the like of the memory cell transistors MT, the amount of electrons injected varies depending on the memory cell transistors MT even when the same program voltage VPGM is applied thereto. The electrons that are temporarily injected are stored until an erasing operation is executed. Therefore, a program operation and a verification operation (loop) for verifying the program operation are executed multiple times while gradually increasing the program voltage VPGM so as not to exceed a threshold voltage range that is allowable as the threshold voltage to be set for each of the memory cell transistors MT. During the write operation, first, an erasing operation in which the threshold voltage of the memory cell transistor MT is returned to the Er state (erase state) is executed. In this way, during the write operation, the program loop consisting of the program operation and the verification operation is repeated multiple times, and the program voltage VPGM increases per each loop.

(Program Operation)

Figure 7:
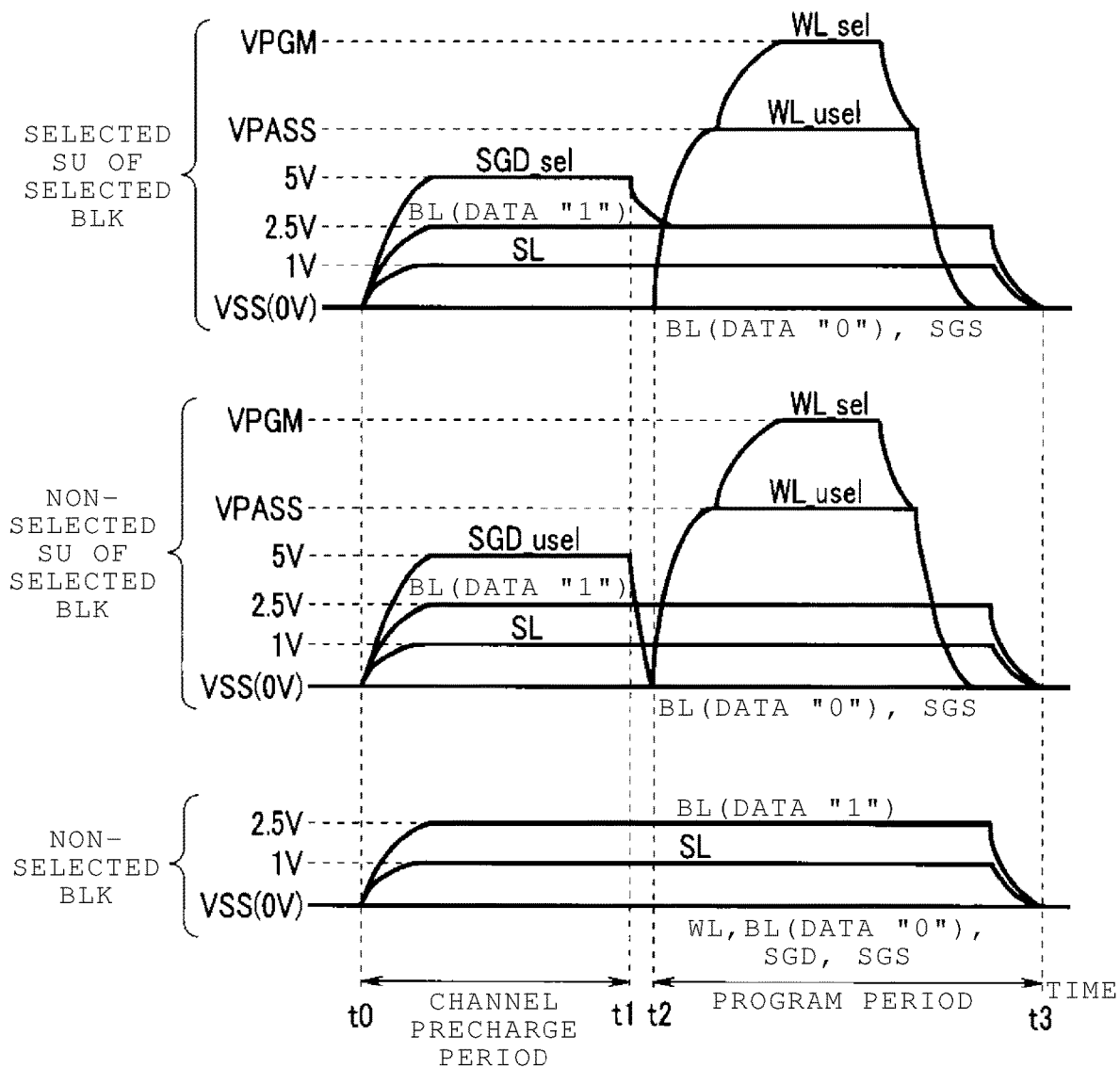
FIG. 7 is a diagram illustrating a potential change of each of wirings during a program operation.

FIG. 7 is a diagram illustrating a potential change of each of wirings during the program operation. The voltage supply circuit 28 controlled by the sequencer 27 generates each of the voltages illustrated in FIG. 7. In FIG. 7, a period from time t0 to time t1 is a period (hereinafter, referred to as "channel pre-charge period") where a channel pre-charge operation described below is executed. A period from time t2 to time t3 is a period (hereinafter, referred to as "program period") where the voltage VPGM is applied.

In the following description, a word line (i.e., selected word line) connected to a memory cell transistor MT to be written is represented by WL_sel, and word lines (i.e., non-selected word lines) other than the selected word line WL are represented by WL_use1. In addition, the select gate line SGD for selecting the memory cell transistor MT of the string unit SU (hereinafter, referred to as selected SU) to be written in the block BLK (hereinafter, referred to as "selected block") to be written or read is represented by SGD_sel, and the select gate line SGD for not selecting the memory cell transistor MT of the non-selected string in the block BLK is represented by SGD_use1.

The program operation is executed in accordance with the program voltage and a bit line voltage to be applied to the word lines and the bit lines, respectively. During the program period, for example, 0 V is applied to the select gate lines SGS. As result, the select gate transistor ST2 is in an OFF state. Next, when the program voltage VPGM is applied, the select gate line SGD (SGD_sel) is set to, for example, 2.5 V. As a result, whether the select gate transistor ST1 is in a conductive or non-conductive state is determined depending on the bit line voltage of the bit lines BL connected to the select gate transistor ST1.

In the string unit SU (i.e., non-selected SU) not to be written in the block BLK (i.e., selected BLK) to be written, for example, 0 V is applied to the select gate line SGD (SGD_use1) during the program period (i.e., during the application of the program voltage VPGM). As a result, the select gate transistor ST1 goes into a non-conductive state and is electrically disconnected from the bit lines BL.

As to the block BLK (i.e., non-selected BLK) not to be written, 0 V is applied to the select gate lines SGD and the select gate lines SGS. As a result, the select transistor ST1 and the select transistor ST2 are in an OFF state.

As described above, the sense amplifier 24 transfers data to each of the bit lines BL. For example, the ground voltage VSS of, for example, 0 V is applied as a bit line voltage Vb1_L to bit lines BL to which data "0" is assigned. A write-protect voltage Vinhibit (e.g., 2.5 V) is applied as a bit line voltage Vb1_H to bit lines BL to which data "1" is assigned. Accordingly, when the program voltage VPGM is applied, the select gate transistor ST1 connected to the bit lines BL to which data "0" is assigned are caused to go into a conductive state, and the select gate transistor ST1 connected to the bit lines BL to which data "1" is assigned is cut off. The memory cell transistors MT connected to the cut-off select gate transistor ST1 are write-protected.

In the memory cell transistors MT connected to the select gate transistor ST1 in the conductive state, electrons are injected into the charge storage film 636 according to the voltage applied to the word lines WL. The memory cell transistors MT connected to the word lines WL to which a voltage VPASS is applied as a word line voltage go into a conductive state irrespective of the threshold voltage, but electrons are not injected into the charge storage film 636. On the other hand, in the memory cell transistors MT connected to the word lines WL to which the program voltage VPGM is applied as a word line voltage, electrons are injected into the charge storage film 636 according to the program voltage VPGM.

That is, the row decoder 25 selects any word line WL in the selected BLK, the program voltage VPGM is applied to a selected word line, and the voltage VPASS is applied to other word lines (i.e., non-selected word lines) WL. The program voltage VPGM is a high voltage for injecting electrons into the charge storage film 636 through tunneling and satisfies VPGM>VPASS.

As a result, charge (i.e., electrons) corresponding to the program voltage VPGM is injected into the charge storage film 636 of the memory cell transistor MT to be written such that the threshold voltage of the memory cell transistor MT increases. In addition, in the memory cell transistor MT not to be written, the threshold voltage is maintained by preventing the injection of electrons into the charge storage film 636.

As illustrated in FIGS. 3 and 4, in the memory cell array 23, one block BLK includes a plurality of string units SU, and each of the word lines WL is connected in common to the plurality of string units SU. Accordingly, in the selected block BLK, the string unit SU (i.e., selected SU) where the cell unit CU (page) as a target of the write operation is present and the string units SU (i.e., non-selected SU) not including the cell unit CU as a target of the write operation are present.

When the program operation is executed on one cell unit CU, in a NAND string NS corresponding to a bit line BL as a non-program target, both of the select gate transistors ST1 and ST2 are cut off, and the channel is in a floating state. In this state, when the program voltage VPGM is applied to the word line WL, the channel is boosted by capacitive coupling with the word line WL (hereinafter, referred to as "channel boosting"). Due to this channel boosting, the memory cell transistors MT of the non-selected SU are write-protected. However, when the channel of the memory cell transistor MT has a negative potential (i.e., lower than the ground voltage VSS) at the start of the program period, even if channel boosting occurs, a potential difference between the channel and the gate of the memory cell transistor MT may be more than a potential difference required for injecting electrons from the channel into the charge storage film 636. That is, erroneous writing (i.e., program disturbance) of data into the memory cell transistor MT which is not a target of the program operation may occur.

In order to prevent the program disturbance, during a period (hereinafter, referred to as "channel pre-charge period") before applying the voltage VPGM to the selected word lines WL_sel, a channel pre-charge operation of changing the channel to stabilize the initial potential of the channel is executed. That is, in the string unit SU (i.e., selected SU) to be written and the string unit SU (i.e., non-selected SU) not to be written in the block BLK (i.e., selected BLK) to be written, in the channel pre-charge period, for example, 5 V is applied to the select gate lines SGS, and the select gate transistor ST2 goes into a conductive state. In this state, by supplying a predetermined channel pre-charge voltage VPRE to the channel, the potential of the channel of the memory cell transistor MT connected to the selected word lines WL_sel and the non-selected word lines WL_use1 is boosted (i.e., stabilized, pre-charged). During the write operation, after the channel pre-charge operation, a combination (i.e., loop) of the program operation and the verification operation for verifying the program operation are executed multiple times while gradually increasing the program voltage VPGM.

(Erasing Operation)

In an erasing operation period when an erasing operation of returning the threshold voltage of the memory cell transistor MT to the Er state is executed, for example, an erase voltage VERA as a high voltage is applied to a source line SELSRC and the bit lines BL. Hole generated by gate-induced drain leakage (GIDL) based on the potential difference between the source line SELSRC and the select gate lines SGS and the potential difference between the bit lines BL and the select gate lines SGD is filled in the channel. As a result, the charge stored in the charge storage film 636 of the memory cell transistor MT and the holes are recombined, electrons are removed, and the threshold voltage returns to the Er state (erase state).

(Negative Swing)

During recovery of the voltage applied to the select gate lines SGS at the end of the channel pre-charge period, during recovery of the program voltage VPGM at the end of the program period, and during recovery of the erase voltage VERA at the end of the erasing operation period, negative swing in which the voltages of the word lines WL and the select gate lines SGS and SGD (control signal lines) swing to the negative side may occur.

Figure 8:
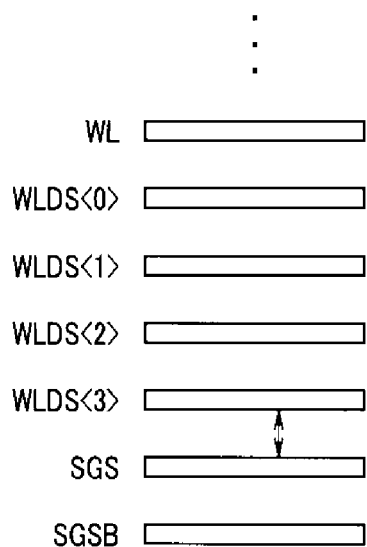
FIG. 8 is a diagram illustrating control signal lines where a problem of negative swing occurs.
Figure 9:
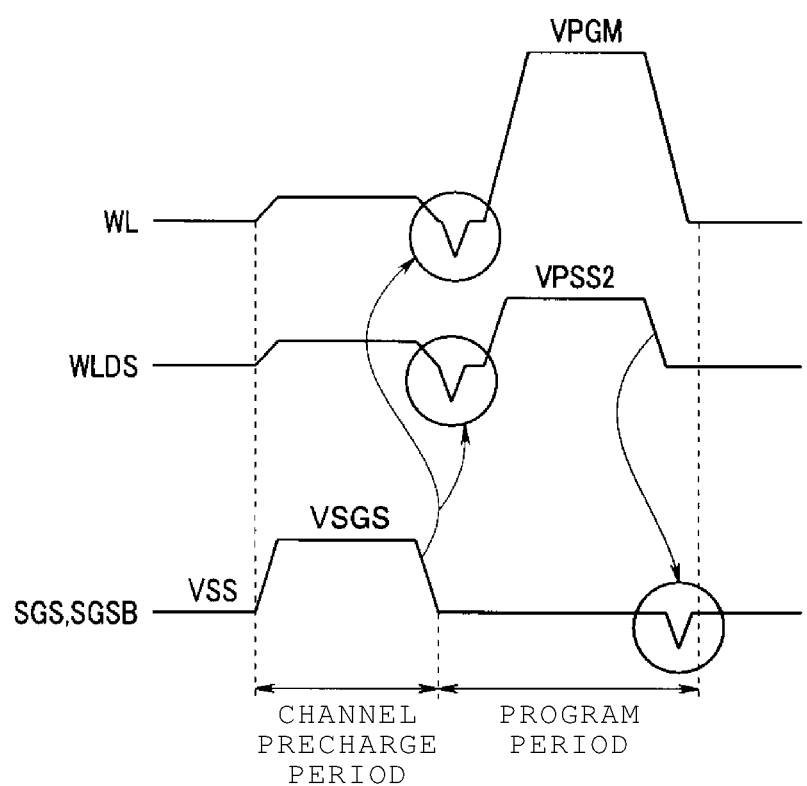
FIG. 9 is a diagram illustrating voltage changes of a word line, dummy word lines, and select gate lines during a channel pre-charge period and a program period.

FIGS. 8 to 11 are diagrams to explain the negative swing. FIG. 8 is a diagram illustrating control signal lines where the negative swing occurs. In the example of FIG. 8, two select gate lines SGS and SGSB are provided as source-side select gate lines, and four dummy word lines WLDS<0> to WLDS<3> (hereinafter, the four dummy word lines WLDS<0> to WLDS<3> will be representatively referred to as "dummy word lines WLDS") are provided between the word line WL and the select gate lines SGS. FIG. 9 is a diagram illustrating voltage changes of the word line WL, the dummy word lines WLDS, and the select gate lines SGS and SGSB, which are control signal lines, during the channel pre-charge period and the program period.

As illustrated in FIG. 9, during the channel pre-charge period, a relatively high predetermined voltage VSGS is applied to the select gate lines SGS and SGSB. On the other hand, a relatively low voltage is applied to the word line WL and WLDS. As a result, during the recovery where the voltage of the select gate lines SGS decreases from the voltage VSGS to 0 V at the end of the channel pre-charge period, negative swing may occur due to capacitive coupling as indicated by arrows in the word line WL and WLDS adjacent to the select gate lines SGS and SGSB (inner round frames in FIG. 9).

In addition, during the program period, the voltage of the select gate lines SGS and SGSB is VSS, and the voltage of the dummy word lines WLDS is a relatively high predetermined voltage VPASS2. During the recovery where the voltage VPASS2 of the dummy word lines WLDS decreases to 0 V, negative swing may occur due to capacitive coupling as indicated by arrows in the select gate lines SGS and SGSB adjacent to each other (an inner round frame in FIG. 9).

During the program period, the voltages supplied to the word line WL and the dummy word lines WLDS are different from those of FIG. 9 depending on parameter settings, and the control signal lines where negative swing occurs may be different from those of FIG. 9. For example, the voltage applied to one side of the word line WL and the dummy word lines WLDS adjacent to each other may be relatively high, and the voltage applied to another side may be relatively low. In this case, during the recovery of voltages in the channel pre-charge period or the program period, negative swing occurs in the word line WL or the dummy word lines WLDS on the other side.

Figure 10:
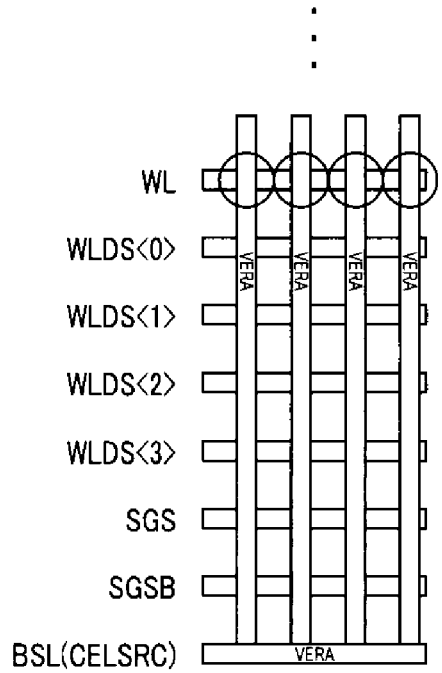
FIG. 10 is a diagram to explain negative swing that occurs in control signal lines during an erasing operation.
Figure 11:
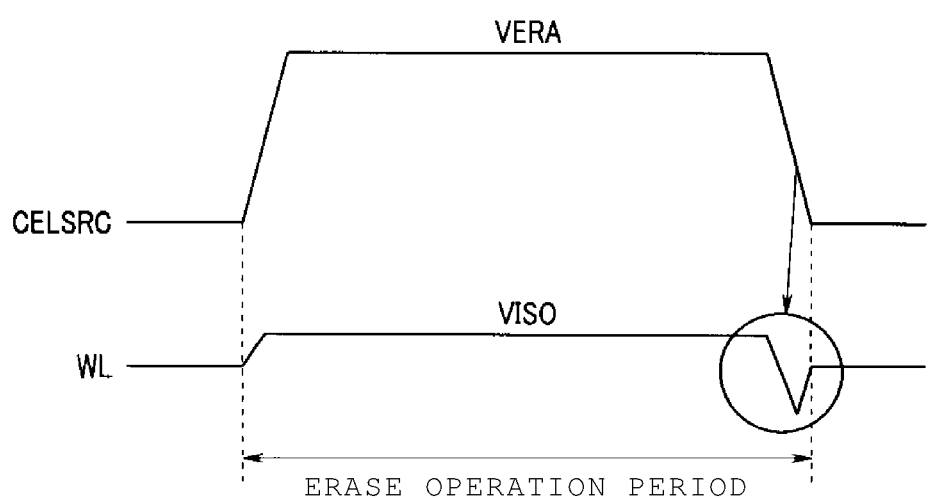
FIG. 11 is a timing chart to explain negative swing that occurs in the control signal lines during the erasing operation.

FIGS. 10 and 11 illustrate an example of negative swing that occurs in the control signal lines during the erasing operation. In the example of FIG. 10, during the erasing operation, the erase voltage VERA is applied from the source line CELSRC to the channel. As illustrated in FIG. 11, in the erasing operation period, the erase voltage VERA is supplied to the source line CELSRC, and a relatively low voltage VISO is applied to the word line WL. During recovery where the voltage of the source line CELSRC decreases from the erase voltage VERA to 0 V, negative swing occurs in the word line WL as indicated by an arrow due to capacitive coupling between the source line CELSRC and the word line WL (round frames in FIG. 11). FIG. 11 does not illustrate a voltage waveform of the dummy word lines WLDS. If a relatively low voltage is applied to the dummy word lines WLDS during the erasing operation period, negative swing occurs in the dummy word lines WLDS.

In this way, when a high voltage on one side decreases due to capacitive coupling between the control signal lines or capacitive coupling between the control signal lines and the channel, negative swing may occur in the control signal lines on the other side.

In each of the transistors TR (i.e., TR_SG0 to TR_SG4 and TR_CG0 to TR_CG7) in the switch circuit group 25A of FIG. 6, the source is connected to the select gate lines SGD0 to SGD3 and SGS and the word lines WL0 to WL7 as the control signal lines. Accordingly, negative swing occurs in the control signal lines, junction forward where a current flows between a substrate (ground voltage VSS) of the transistors TR and the source to which the control signal lines are connected may occur. As a result, an unnecessary current may flow and a latch-up of the transistors TR may occur.

To address such an issue, in the present embodiment, the negative voltage generation circuit 28a is provided in the voltage supply circuit 28, and a double well structure is adopted as the transistors TR of the row decoder 25.

Figure 12:
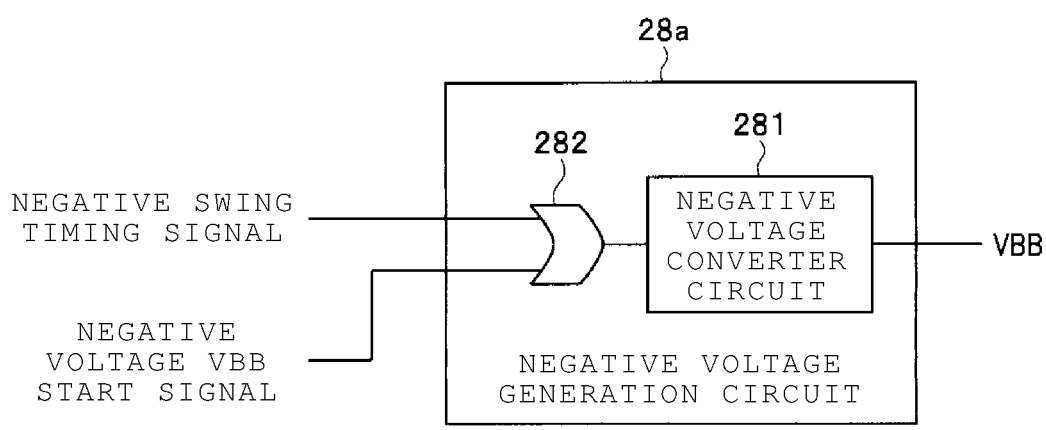
FIG. 12 is a block diagram illustrating an example of a specific configuration of a negative voltage generation circuit.

FIG. 12 is a block diagram illustrating an example of a specific configuration of the negative voltage generation circuit 28a.

The negative voltage generation circuit 28a in the voltage supply circuit 28 includes a negative voltage converter circuit 281 and an OR circuit 282. The ground voltage VSS is applied to the negative voltage converter circuit 281 through the power input terminal group 35 (not illustrated), and the negative voltage converter circuit 281 converts the ground voltage VSS into the negative voltage VBB. A negative voltage VBB start signal and a negative swing timing signal are input to the OR circuit 282. The negative voltage VBB start signal and the negative swing timing signal are supplied from the sequencer 27. When the negative voltage VBB needs to be supplied to the control signal lines during the read operation, the verification operation, or the like, the sequencer 27 generates the negative voltage VBB start signal representing a supply timing of the negative voltage VBB. When a high level (hereinafter, referred to as "H level") signal based on the VBB start signal is applied from the OR circuit 282, the negative voltage converter circuit 281 outputs the negative voltage VBB. In this case, the negative voltage VBB is supplied to the corresponding control signal line through a switch (not illustrated). This switch is controlled by the sequencer 27 to be turned off when a negative voltage is not required for the control signal lines.

In the present embodiment, to prevent the unintended negative swing illustrated in FIGS. 8 to 11 and the like that occurs in the control signal lines, the sequencer 27 is configured to generate the negative swing timing signal. For example, as described above, negative swing occurs in the control signal lines at the end of the channel pre-charge period, at the end of the program period (i.e., voltage VPASS2 application period), and at the end of the erasing operation period. For example, the sequencer 27 is configured to generate the negative swing timing signal depending on the periods where negative swing occurs. When an H level signal based on the negative swing timing signal is applied from the OR circuit 282, the negative voltage converter circuit 281 outputs the negative voltage VBB. In this case, the negative voltage generation circuit 28a supplies the negative voltage VBB to each of the block decoders 25B of the row decoder 25.

Figure 13A:
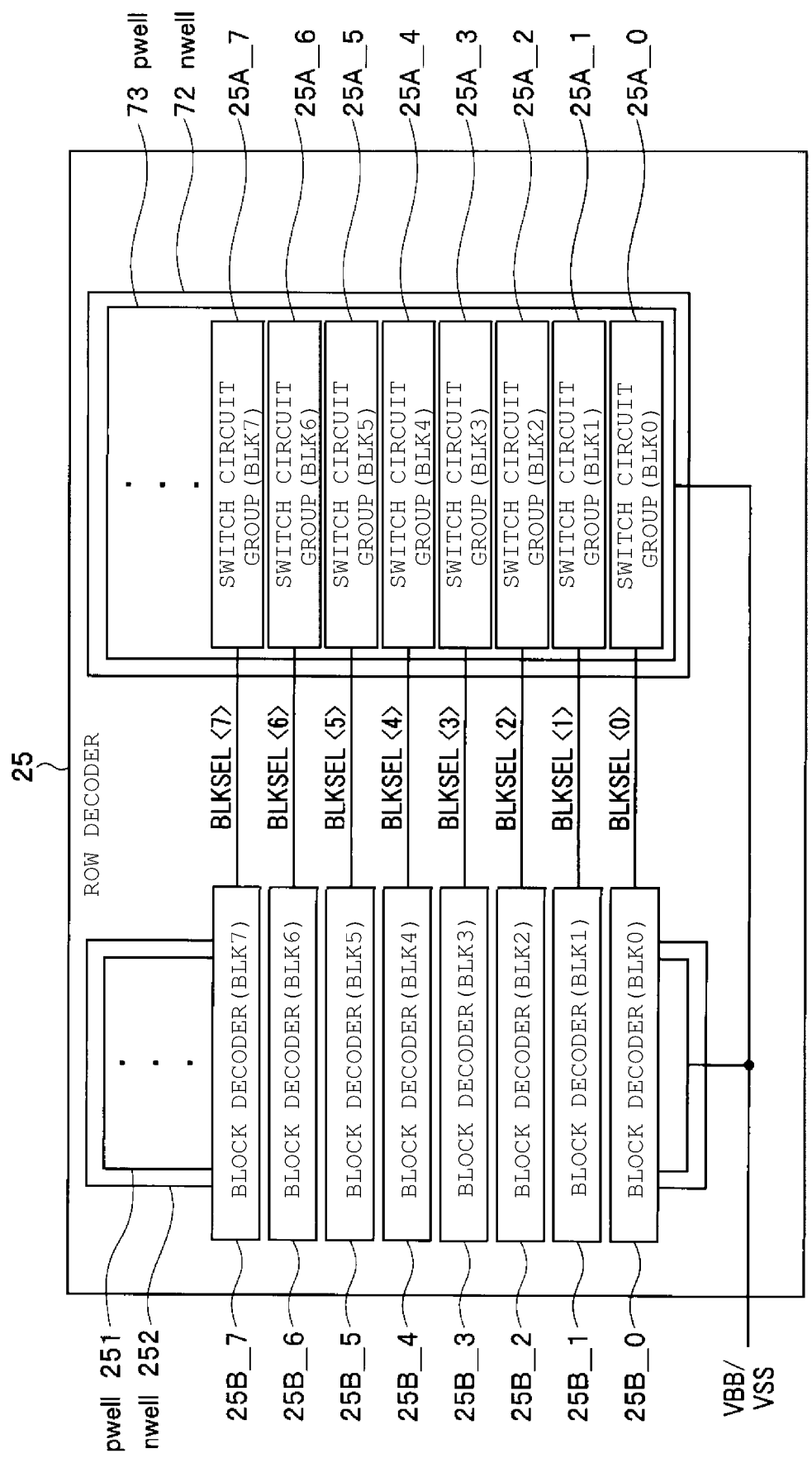
FIG. 13A is a schematic diagram illustrating an example of a configuration of the row decoder.
Figure 13B:
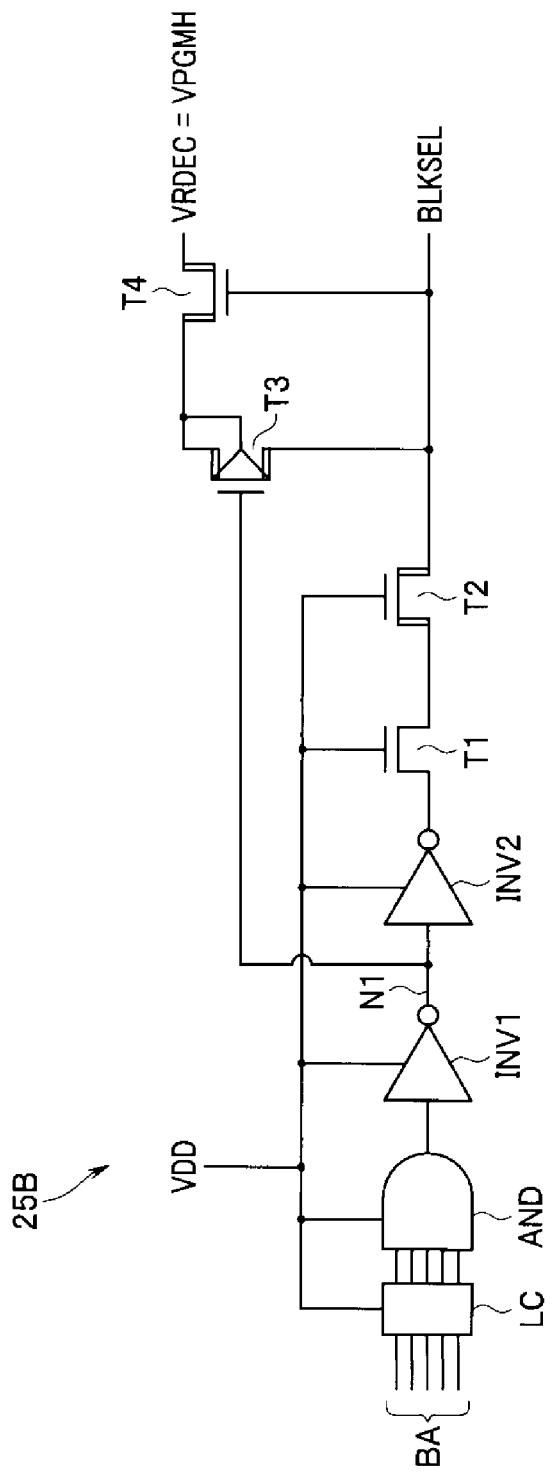
FIG. 13B is a circuit diagram illustrating an example of a specific configuration of a block decoder.
Figure 13C:
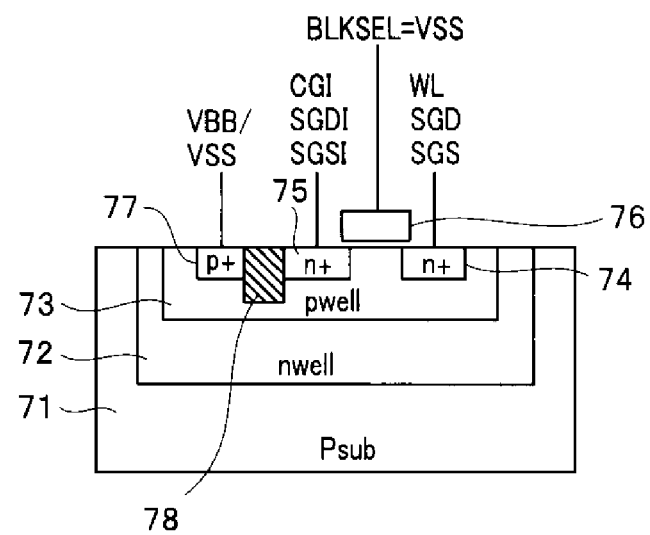
FIG. 13C is a schematic diagram illustrating an example of a specific configuration of a transistor.

FIG. 13A is a schematic diagram illustrating an example of a configuration of the row decoder 25. FIG. 13B is a circuit diagram illustrating an example of a specific configuration of the block decoder 25B. FIG. 13C is a schematic diagram illustrating an example of a specific configuration of the transistor TR.

As illustrated in FIG. 13A, the row decoder 25 includes: a Pwell 251 that is formed in an Nwell 252; and a Pwell 73 that is formed in an Nwell 72. A transistor of a part of each of a plurality of block decoders 25B_0, 25B_1, and ... (the block decoders 25B in FIG. 6) is formed on the Pwell 251, and other transistors are not formed in the Pwell 251. In addition, a plurality of switch circuit groups 25A_0, 25A_1, and ... (the switch circuit groups 25A in FIG. 6) are configured on the common Pwell 73.

The ground voltage VSS or the negative voltage VBB is supplied to the Pwells 251 and 73 through a common wiring.

As illustrated in FIG. 13B, the block decoder 25B includes a logic circuit LC, an AND circuit AND, inverters INV1 and INV2, and transistors T1, T2, T3, and T4. The transistors T1, T2, and T4 are N-channel MOSFETs. The transistors T1 and T2 are applied with a negative voltage and are formed in the Pwell 251. The transistor T4 or other N-channel MOSFETs are formed in the semiconductor substrate (Psub) 71. The transistor T3 is a P-channel MOSFET. The transistor T3 or other P-channel MOSFETs are formed in the N-well. The transistors T2, T3, and T4 are high breakdown voltage MOSFETs where the physical film thickness of the gate insulating film is more than that of the transistor T1. The physical film thickness of the gate insulating film of each of the transistors T2, T3, and T4 is, for example, 10 nm or more. In addition, the gate-to-source voltage of each of the transistors T2, T3, and T4 may be, for example, a voltage of 10 V or higher. On the other hand, the physical film thickness of the gate insulating film of the transistor T1 is less than, for example, 10 nm. In addition, the gate-to-source voltage of the transistor T1 is, for example, a voltage of lower than 10 V.

A block address BA is input from the register 26 to a first terminal of the logic circuit LC. For example, a power supply voltage VDD is applied to a second terminal of the logic circuit LC. The logic circuit LC is driven by the power supply voltage VDD. A signal based on the block address BA is output from a third terminal of the logic circuit LC. When the block address BA input to the logic circuit LC is the block address BA assigned to the block BLK corresponding to the logic circuit LC, an "H" level signal is output from the second terminal of the logic circuit LC. When the block address BA input to the logic circuit LC is not the block address BA assigned to the block BLK corresponding to the logic circuit LC, an "L" level signal is output from the second terminal of the logic circuit LC.

The third terminal of the logic circuit LC is connected to a first terminal of the AND circuit AND. For example, the power supply voltage VDD is applied to a second terminal of the AND circuit AND. The AND circuit AND is driven by the power supply voltage VDD. A signal based on an AND operation of the signal output from the third terminal of the logic circuit LC is output from a third terminal of the AND circuit AND.

A first terminal of the inverter INV1 is connected to the third terminal of the AND circuit AND. For example, the power supply voltage VDD is applied to a second terminal of the inverter INV1. The inverter INV1 is driven by the power supply voltage VDD. A third terminal of the inverter INV1 is connected to a node N1. An inverted signal of the signal output from the third terminal of the AND circuit AND is output from the third terminal of the inverter INV1.

A first terminal of the inverter INV2 is connected to the node N1. For example, the power supply voltage VDD is applied to a second terminal of the inverter INV2. The inverter INV2 is driven by the power supply voltage VDD. An inverted signal of the signal output from the third terminal of the inverter INV1 is output from a third terminal of the inverter INV2.

A first terminal of the transistor T1 is connected to the third terminal of the inverter INV2. The power supply voltage VDD is applied to the gate of the transistor T1. A second terminal of the transistor T1 is connected to the transistor T2.

A first terminal of the transistor T2 is connected to the second terminal of the transistor T1. The power supply voltage VDD is applied to the gate of the transistor T2. A second terminal of the transistor T2 is connected to a transfer gate line BLKSEL through which the block selection signal BLKSEL is supplied.

A first terminal of the transistor T3 is connected to the transfer gate line BLKSEL. The gate of the transistor T3 is connected to the node N1. A second terminal of the transistor T3 is connected to a back gate of the transistor T3 and a transistor T4.

A first terminal of the transistor T4 is connected to the second terminal of the transistor T3 and the back gate of the transistor T3. The gate of the transistor T4 is connected to the transfer gate line BLKSEL. A second terminal of the transistor T4 is connected to a node VRDEC. High voltages are applied to the node VRDEC, the voltages being set such that transfer transistors TW, TS, and TD can transfer the voltages supplied to the corresponding signal lines CG to the word lines WL, the select gate lines SGS, and the select gate lines SGD by transferring the voltages to the transfer gate line BLKSEL through the transistors T3 and T4.

According to the above-described configuration, when the corresponding block BLK is selected, the block decoder 25B outputs an H level signal to the transfer gate line BLKSEL. When the corresponding block BLK is not selected, the block decoder 25B outputs a low level (hereinafter, referred to as "L level") signal to the transfer gate line BLKSEL.

Each of the transistors TR of the switch circuit group 25A may be configured with, for example, the NMOS transistor having the double well structure illustrated in FIG. 13C. That is, in the transistor TR, the Nwell 72 is formed in a predetermined region of the P-type semiconductor substrate (Psub) 71. The Pwell 73 is formed in the Nwell 72. A source region 74 and a drain region 75 are formed in the Pwell 73. A gate electrode 76 formed of a conductive material is provided on the semiconductor substrate between the source region 74 and the drain region 75 through a gate insulating film. The transistor TR is formed with the source region 74, the drain region 75, and the gate electrode 76. The signal line CGI, SGDI, or SGSI is connected to the drain region 75, and the signal line WL, SGD, or SGS is connected to the source region 74. For convenience of description, FIG. 13C illustrates one transistor TR in the Pwell 73. Typically, a plurality of transistors TR are provided in the Pwell 73.

In the present embodiment, a p+ contact 77 is formed in the Pwell 73. The power supply voltage VSS or the negative voltage VBB is applied to the Pwell 73 through the p+ contact 77. As illustrated in FIG. 13A, each of the switch circuit groups 25A in the row decoder 25 is formed in the Pwell 73, and the Pwell 73 is shared by the switch circuit groups 25A. For that reason, a common voltage can be applied to the Pwell 73 where the transistor TR is formed in each of the switch circuit groups 25A. The drain region 75 and the p+ contact 77 are electrically isolated by an element isolation region 78.

Figure 14A:
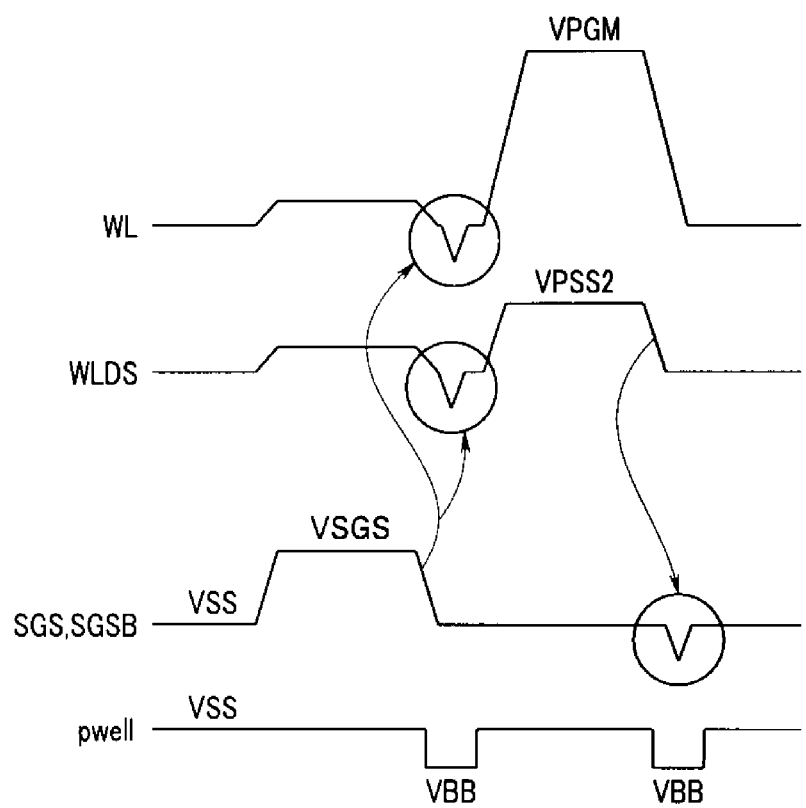
FIG. 14A is a diagram corresponding to the example of FIG. 9 illustrating a timing at which a negative voltage is generated.
Figure 14B:
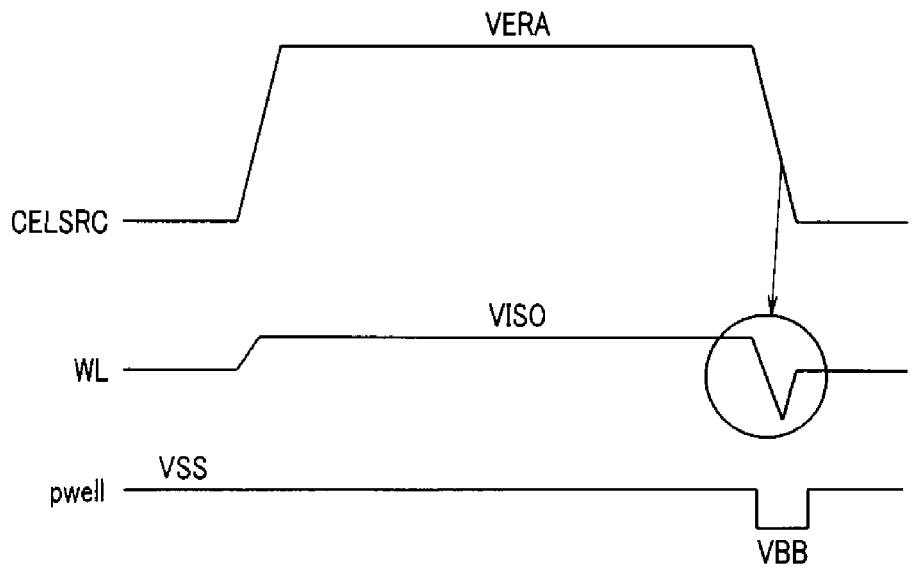
FIG. 14B is a diagram corresponding to the example of FIG. 11 illustrating a timing at which the negative voltage is generated.

Next, an operation of the memory system according to the present embodiment having the above-described configuration will be described with reference to FIGS. 14A and 14B. FIG. 14A is a diagram corresponding to the example of FIG. 9 and illustrates a timing at which an unnecessary negative voltage can be generated. FIG. 14B is a diagram corresponding to the example of FIG. 11 illustrating a timing at which the unnecessary negative voltage can be generated.

The example of FIG. 14A illustrates that the negative voltage VBB is generated at the end of the channel pre-charge period and at the end of the program period (i.e., during the recovery where the voltage of the dummy word lines WLDS decreases from the voltage VPASS2 to 0 V). The sequencer 27 outputs the negative swing timing signal for generating the negative voltage VBB at the timing at which the negative voltage VBB is generated, for example, at the end of the channel pre-charge period and at the end of the program period (i.e., the voltage VPASS2 application period). In addition, the example of FIG. 14B illustrates that the negative voltage VBB is generated at the end of the erasing operation period. The sequencer 27 outputs the negative swing timing signal for generating the negative voltage VBB at the timing at which the negative voltage VBB is generated, for example, at the end of the erasing operation period.

This negative swing timing signal is supplied from the voltage supply circuit 28 to the block decoder 25B in the row decoder 25. The block decoder 25B supplies the negative voltage VBB to the contact 77 of the Pwell 73.

That is, in the example of FIG. 14A, the block decoder 25B supplies, to the contact 77 of the Pwell 73, the negative voltage VBB at the end of the channel pre-charge period and the negative voltage VBB at the end of the program period (the voltage VPASS2 application period). In this way, the voltage indicated by "pwell" in FIG. 14A is supplied to the Pwell 73. In addition, in the example of FIG. 14B, the block decoder 25B supplies, to the contact 77 of the Pwell 73, the negative voltage VBB at the end of the erasing operation period. In this way, the voltage indicated by "pwell" in FIG. 14B is supplied to the Pwell 73. As a result, the Pwell 73 of the transistor TR where the negative voltage VBB is applied to the contact 77 is biased to the negative voltage VBB. As a result, even when negative swing occurs in the source region 74, junction forward does not occur.

When the negative voltage VBB is applied to the Pwell 73 in a state where a relatively high voltage such as the program voltage VPGM is applied to the control signal lines such as the word lines WL, a voltage difference between the Pwell 73 and the source region 74 increases significantly, breakdown voltage is exceeded. To address such an issue, the sequencer 27 executes a control such that the negative voltage VBB is applied to the Pwell 73 during a period when unintended negative swing occurs in the control signal lines and the application of the negative voltage VBB to the Pwell 73 is prevented in the other periods.

In this way, according to the present embodiment, a predetermined negative voltage is supplied to a transistor configuring a switch in the row decoder to suppress the negative swing occurring at the voltage of the control signal lines. As a result, the occurrence of junction forward in a transistor is prevented and thus the reliability of an operation of the row decoder can be improved.

In the above description, all of the transistors TR of the switch circuit group 25A are formed in the common Pwell 73, and the negative voltage VBB is applied in common to all of the transistors TR of the switch circuit group 25A. Alternatively, all of the transistors TR of the switch circuit group 25A may be divided and formed in a plurality of Pwells 73, and the contacts 77 of the Pwells 73 may be connected to the negative voltage generation circuit 28a using independent wirings. In this case, the negative voltage generation circuit 28a can apply individual voltages to the contacts 77 of the plurality of Pwells 73, respectively.

For example, in the example of FIG. 14A, the negative voltage generation circuit 28a supplies the negative voltage VBB, at the end of the channel pre-charge period, to the contact 77 of the Pwell 73 where the transistors TR connected to the word lines WL and the dummy word lines WLDS are formed. In addition, the negative voltage generation circuit 28a supplies the negative voltage VBB, at the end of the program period (i.e., voltage VPASS2 application period) to the contact 77 of the Pwell 73 where the transistors TR connected to the select gate lines SGS and SGSB are formed. In addition, for example, the negative voltage generation circuit 28a supplies the negative voltage VBB, at the end of the erasing operation period, to the contact 77 of the Pwell 73 where the transistors TR connected to the word lines WL are formed. As a result, the Pwell 73 of the transistor TR is biased to the negative voltage VBB. As a result, even when negative swing occurs in the source region 74, junction forward does not occur.

Second Embodiment

Figure 15:
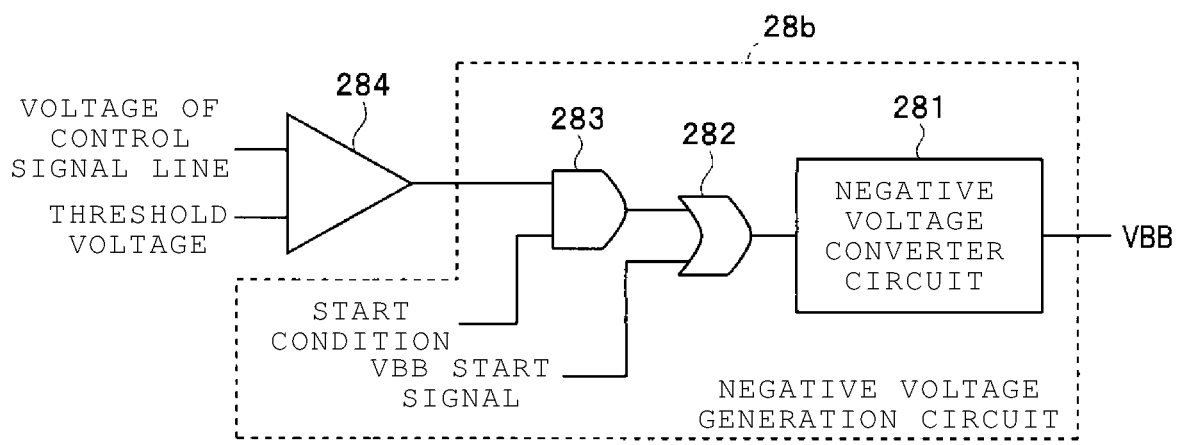
FIG. 15 is a block diagram illustrating a negative voltage generation circuit in a second embodiment.

FIG. 15 is a block diagram illustrating a negative voltage generation circuit according to a second embodiment. In FIG. 15, the same components as those of FIG. 12 are represented by the same reference numerals, and the description thereof will not be repeated.

In the description of the first embodiment, the sequencer 27 acquires the information regarding the timing at which negative swing occurs in advance. In the second embodiment, the occurrence of negative swing is detected by measuring the voltage of the control signal line. In the second embodiment, a negative voltage generation circuit 28b is used instead of the negative voltage generation circuit 28a.

As illustrated in FIG. 15, the negative voltage generation circuit 28b has a configuration in which an AND circuit 283 is added to the negative voltage generation circuit 28a. In addition, in the present embodiment, a comparator 284 connected to the control signal line such as the select gate lines SGD and SGS and the word line WL is used. The voltage is applied from the control signal line to one input terminal of the comparator 284. In addition, a threshold voltage is applied to another input terminal of the comparator 284. As the threshold voltage, a voltage for determining unintended negative swing, for example, the ground voltage VSS is set. The comparator 284 configures a negative swing detection circuit and outputs a negative swing detection output regarding whether the voltage of the control signal line decreases to be lower than the threshold voltage, that is, whether negative swing occurs to the AND circuit 283.

Figure 16A:
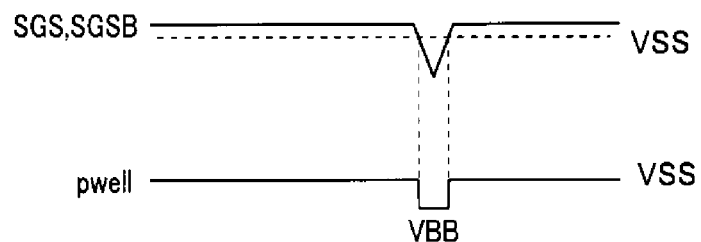
FIG. 16A is a timing chart illustrating the negative voltage that is generated by negative swing occurring in the control signal line.
Figure 16B:
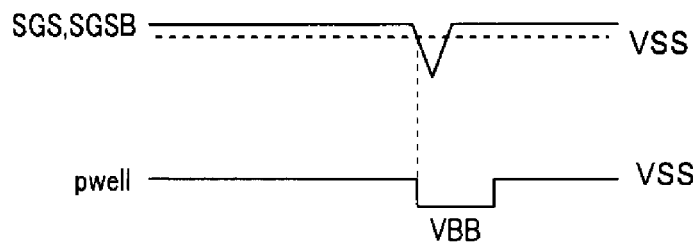
FIG. 16B is a timing chart illustrating the negative voltage that is generated by negative swing occurring in the control signal line.

FIGS. 16A and 16B are timing charts illustrating the negative voltage VBB that is generated in response to negative swing occurring in the control signal line.

FIGS. 16A and 16B illustrate the example in which negative swing occurs in the select gate line SGS or SGSB. The voltage of the select gate line SGS or SGSB is supplied to the comparator 284, and the comparator 284 compares the voltage of the select gate line SGS or SGSB to a threshold voltage (e.g., ground voltage VSS) indicated by a broken line in FIGS. 16A and 16B. When negative swing occurs in the select gate line SGS or SGSB, the comparator 284 generates the negative swing timing signal at a timing at which the voltage of the select gate line SGS or SGSB decreases to be lower than the threshold voltage (e.g., ground voltage VSS).

FIG. 16A illustrates the example where the negative swing timing signal transitions to the negative voltage VBB during the period when the voltage of the select gate line SGS or SGSB decreases to be lower than the threshold voltage (e.g., ground voltage VSS). In addition, FIG. 16B illustrates the example where the negative swing timing signal as the negative voltage VBB is generated for a certain period from the timing at which the voltage of the select gate line SGS or SGSB decreases to be lower than the threshold voltage (ground voltage VSS).

This negative swing timing signal is applied to the AND circuit 283. Information regarding a start condition is input to the AND circuit 283. As described above, when the negative voltage VBB is applied to the Pwell 73 in a state where a relatively high voltage is applied to the control signal line, a voltage difference between the Pwell 73 and the source region 74 increases significantly, breakdown voltage is caused in the transistor TR. Therefore, for example, as the start condition, information representing a period other than the period when a relatively high voltage is supplied to the control signal line, for example, the period when the voltage VPGM is generated may be used.

When the start condition is satisfied, the AND circuit 283 outputs the negative swing detection output as the negative swing timing signal to the OR circuit 282. The negative voltage VBB is generated from the negative voltage converter circuit 281 based on the output of the OR circuit 282. In the example of FIG. 16A, the negative swing timing signal is generated for the period when negative swing occurs from the timing at which negative swing is detected, and the negative voltage VBB to be applied to the Pwell 73 is generated for the period indicated by the negative swing timing signal. In addition, in the example of FIG. 16B, the negative swing timing signal representing a period longer than the period when negative swing occurs from the timing at which negative swing is detected is generated, and the negative voltage VBB to be applied to the Pwell 73 is generated for a predetermined period.

In this way, in the second embodiment, the sequencer 27 does not need to acquire the information regarding the timing at which negative swing occurs in advance, the timing at which negative swing occurs is detected by the negative voltage generation circuit 28b, and the negative voltage VBB is generated based on the detection result. The other effects are the same as those of the first embodiment.

The circuit illustrated in FIG. 15 detects negative swing occurring in one control signal line and supplies the negative voltage VBB. In order to detect negative swing of a plurality of control signal lines, the comparators 284 corresponding to the number of control signal lines where negative swing is detected needs to be provided such that, for example, outputs of all of the comparators 284 are supplied to the AND circuit 283 through a multi-input OR circuit. If negative swing of all of the control signal lines needs to be detected, a very large number of comparators 284 are required.

To address such an issue, it is considered that a required number of comparators 284 is reduced by detecting the negative swing of the control signal lines in a global path from the voltage supply circuit 28 to the row decoder 25 through which the voltage is supplied to the control signal lines in the memory cell array 23 instead of detecting the negative swing of the control signal line (e.g., SGS, SGD, WL) in the memory cell array 23.

Figure 17:
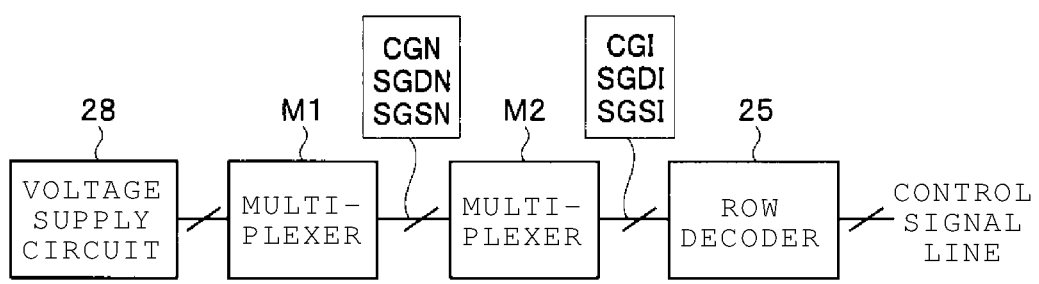
FIG. 17 is a diagram illustrating a part of a signal line from a voltage supply circuit to a row decoder through which various voltages are supplied from the voltage supply circuit.

FIG. 17 is a diagram illustrating the summary of a signal path from a voltage supply circuit 28 to the row decoder 25 through which various voltages are supplied from the voltage supply circuit 28.

As illustrated in FIG. 17, the voltage generated by the voltage supply circuit 28 is supplied to each of the control signal lines SGS, SGD, and WL in the memory cell array 23 through multiplexers M1 and M2 and the row decoder 25. The outputs of the multiplexer M2 are the control signal line SGSI corresponding to the control signal line SGS, the control signal line SGDI corresponding to the control signal line SGD, and the control signal line CGI corresponding to the control signal line WL. In addition, outputs of the multiplexer M1 are a control signal line SGSN corresponding to the control signal line SGSI, a control signal line SGDN corresponding to the control signal line SGDI, and a control signal line CGN corresponding to the control signal line CGI.

Figure 18:
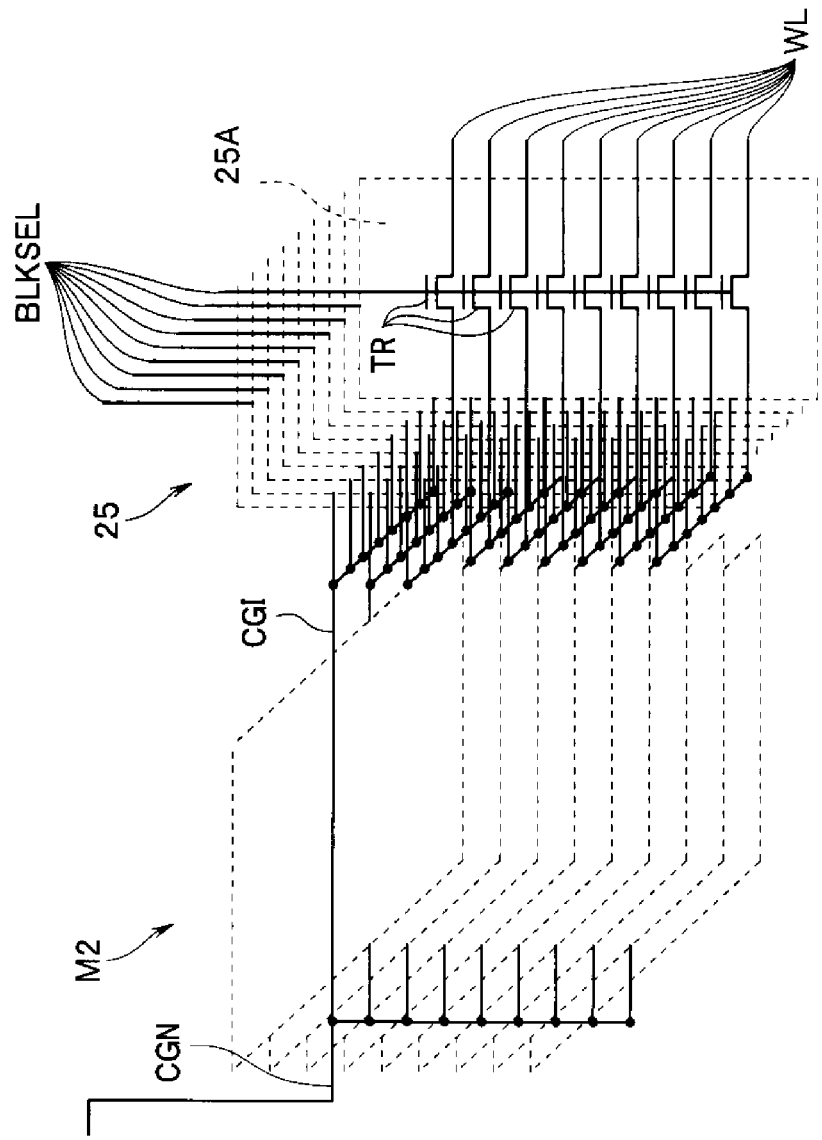
FIG. 18 is a diagram illustrating one control signal line in a path from an input of a multiplexer in FIG. 17 to word lines.

FIG. 18 is a diagram illustrating one control signal line CGN in a path from an input of the multiplexer M2 in FIG. 17 to the word lines WL.

As described above, the row decoder 25 includes the switch circuit groups 25A surrounded by broken lines corresponding to the blocks BLK in the memory cell array 23.

Typically, the word lines WL positioned in the same layer among the word lines WL in all of the blocks BLK are connected to one control signal line CGI. The number of the control signal lines CGI is the same as the number of the word lines WL in one block BLK. Each of the control signal lines CGI corresponds to one control signal line CGN. The multiplexer M2 indicated by a plurality of broken line frames selects the control signal line CGI corresponding to one of the word lines WL to which the voltage transmitted through one control signal line CGN is supplied.

FIG. 18 illustrates the example in which the number of the control signal line CGN is 1, the number of the control signal lines CGI is 9, the number of the blocks is 9, and the number of the word lines WL is 81 (nine control signal lines CGI×nine blocks). Typically, a few to dozen control signal lines CGN is provided, the number of the control signal lines CGI is several tens to several hundreds, the number of the blocks is several thousands, and the number of the word lines WL is several ten thousands. Accordingly, the magnitude correlation between the typical numbers of wirings of the control signal lines satisfies CGN<CGI<WL. Regarding the other control signal lines, the same configuration is applied. That is, the numbers of wirings satisfy SGDN<SGDI<SGD and SGSN<SGSI<SGS. Hereinafter, the control signal lines CGN, SGDN, and SGSN will be collectively referred to as "control signal lines GN".

Figure 19:
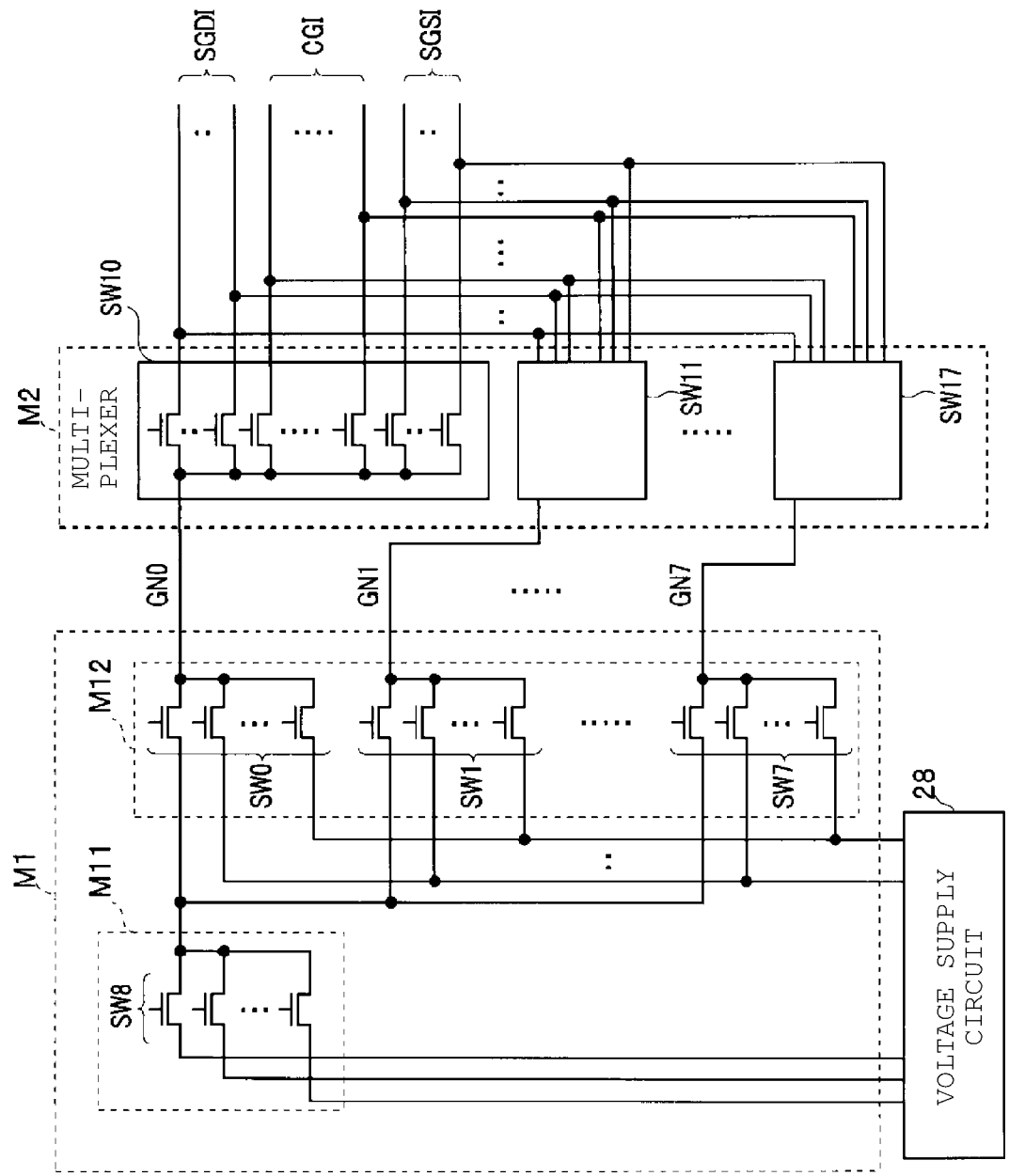
FIG. 19 is a diagram illustrating a wiring path from the voltage supply circuit to the row decoder.

FIG. 19 is a diagram illustrating a wiring path from the voltage supply circuit 28 to the row decoder 25. Numbers are added to a plurality of control signal lines GN to represent that the control signal lines GN are different signal lines. FIG. 19 illustrates the example where the number of the control signal lines GN is 8. It is noted that the number of the control signal lines GN is not limited to this example.

The multiplexer M1 includes two multiplexers M11 and M12. The multiplexer M11 includes a switch group SW8 having a plurality of switches. The multiplexer M12 includes switch groups SW0 to SW7 each of which has a plurality of switches. The switch group SW8 is supplied with plural types of voltages from the voltage supply circuit 28, selects one type of voltage from the voltages, and outputs the selected voltage to the switch groups SW0 to SW7. Not only the voltage supplied from the switch group SW8 but also plural types of voltages from the voltage supply circuit 28 are supplied to the switch groups SW1 to SW7. Each of the switch groups SW1 to SW7 selects one type of voltage from the supplied voltages, and the selected voltages are output to the control signal lines GN1 to GN7, respectively.

In this way, the multiplexer M1 can output eight types of voltages to the multiplexer M2 through the control signal lines GN0 to GN7. The multiplexer M1 outputs voltages required for the read operation, the write operation, and the erasing operation. For example, during the read operation, a voltage VREADK, a voltage VREAD, a voltage VREADL, and a voltage VCGRV are output from the multiplexer M1 as the control signal lines CGN in order from the highest voltage.

The multiplexer M2 includes switch groups SW10 to SW17, each including a plurality of switches. The switch groups SW10 to SW17 have the same configuration. Input terminals of the switches in the switch group SW10 are connected in common to the control signal line GN0. Output terminals of the switches in the switch group SW10 are connected to the control signal lines SGDI, CGI, and SGSI, respectively. The switch group SW10 determines which one of the control signal lines is a control signal line to which the voltage is supplied through the control signal line GN0. For example, when the read voltage VCGRV is transmitted through the control signal line GN0, each of the switches in the switch group SW10 is controlled such that the read voltage VCGRV is supplied to the control signal line CGI corresponding to the word line WL to be read.

Likewise, as illustrated in FIG. 19, input terminals of the switches in the switch groups SW10 to SW17 are connected to the control signal lines GN1 to GN7, respectively. In addition, as illustrated in FIG. 19, output terminals of the switch groups SW10 to SW17 are connected to the control signal lines SGDI, CGI, and SGSI, respectively.

Each of the switches in the switch groups SW11 to SW17 is controlled such that the voltages transmitted through the control signal lines GN1 to GN7 are supplied to the control signal lines SGDI, CGI, and SGSI corresponding to the control signal lines SGD, WL, and SGS in the memory cell array 23 to which the voltages are to be supplied. In this way, the corresponding voltages are supplied from the multiplexer M2 to the control signal lines SGDI, SGSI, and CGI. For example, during the write operation, each of the switches in the switch group where the voltage VPASS is transmitted through the control signal lines GN is controlled such that the voltage VPASS is supplied to a plurality of control signal lines CGI corresponding to the non-selected word lines WL_use1.

Figure 20:
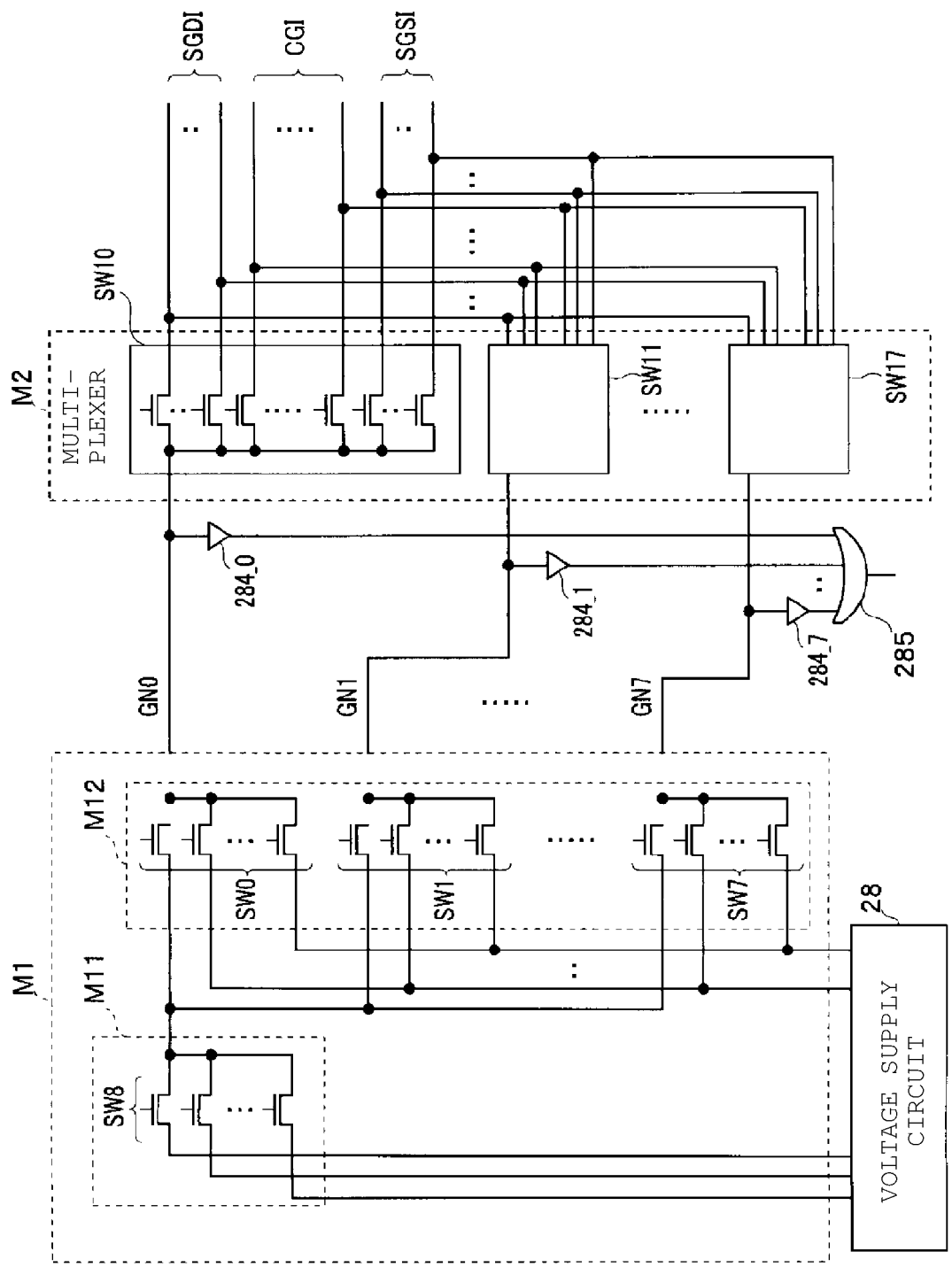
FIG. 20 is a diagram illustrating an example of detection of the negative swing in control signal lines.

(Detection in Control Signal Lines GN) FIG. 20 is a diagram illustrating an example of detecting negative swing at the control signal lines GN. In FIG. 20, the same components as those of FIG. 19 are represented by the same reference numerals, and the description thereof will not be repeated. In the example of FIG. 20, comparators 284_0 to 284_7 are connected to the control signal lines GN0 to GN7, respectively. The comparators 284_0 to 284_7 have the same configuration as the comparator 284 in FIG. 15. Each of the comparators 284_0 to 284_7 compares the voltage of the control signal line GN connected thereto with the threshold voltage and outputs the negative swing detection output indicating that negative swing is occurring. The outputs of the comparators 284_0 to 284_7 are applied to an OR circuit 285. The OR circuit 285 outputs the logical sum of the outputs of the comparators 284_0 to 284_7 to the AND circuit 283 of the negative voltage generation circuit 28b illustrated in FIG. 15. Based on the outputs of the comparators 284_0 to 284_7 and the OR circuit 285, negative swing occurring in one of the control signal lines GN is detected.

When negative swing occurs in one of the control signal lines GN, the output of the OR circuit 285 becomes an H level, and the negative voltage VBB is output from the negative voltage generation circuit 28b. In this way, when negative swing occurs in one of the control signal lines GN, the negative voltage VBB is supplied to the transistors TR of the row decoder 25, and the occurrence of junction forward in the transistors TR is prevented.

(Detection in Signal Line through which Voltage VISO1VDD is Supplied)

Figure 21:
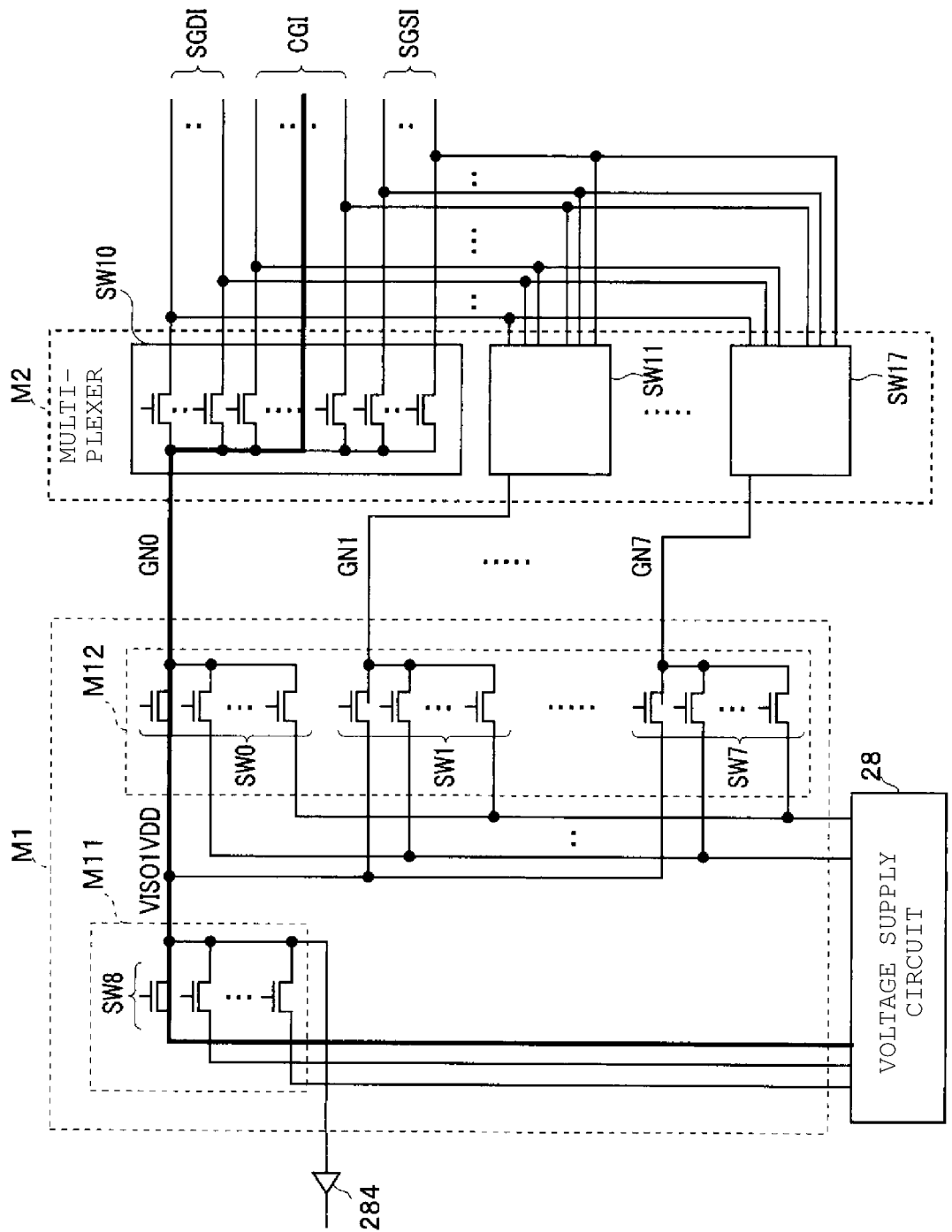
FIG. 21 is a diagram illustrating an example of detection of a voltage of a wiring through which a voltage is supplied to the word lines during the erasing operation.

FIG. 21 is a diagram illustrating an example of detecting a voltage of a wiring through which a voltage VISO1VDD is applied to the word lines WL during the erasing operation. In FIG. 21, the same components as those of FIG. 19 are represented by the same reference numerals, and the description thereof will not be repeated. A thick line in FIG. 21 indicates a supply path of the voltage VISO1VDD. The voltage supply circuit 28 generates the voltage VISO1VDD. This voltage is transmitted to the control signal line GN0, for example, through the switches in the switch group SW8 and the switches in the switch group SW0, and is transmitted from the control signal line GN0 to each of the switches in the switch group SW10. The switches in the switch group SW10 supply the voltage VISO1VDD to the control signal lines CGI corresponding to the word lines WL.

In this case, the comparator 284 compares the voltage at each of positions in the supply path of the voltage VISO1VDD to a threshold voltage to detect negative swing. The output of the comparator 284 is supplied to the AND circuit 283 in FIG. 15. As a result, negative swing occurring at the end of the erasing operation period when the erasing operation illustrated in FIG. 11 is executed can be detected. In this way, at the end of the erasing operation, the occurrence of junction forward in the transistors TR of the row decoder 25 is prevented.

(Detection in Signal Line through which Voltage VCGSEL is Supplied)

Figure 22:
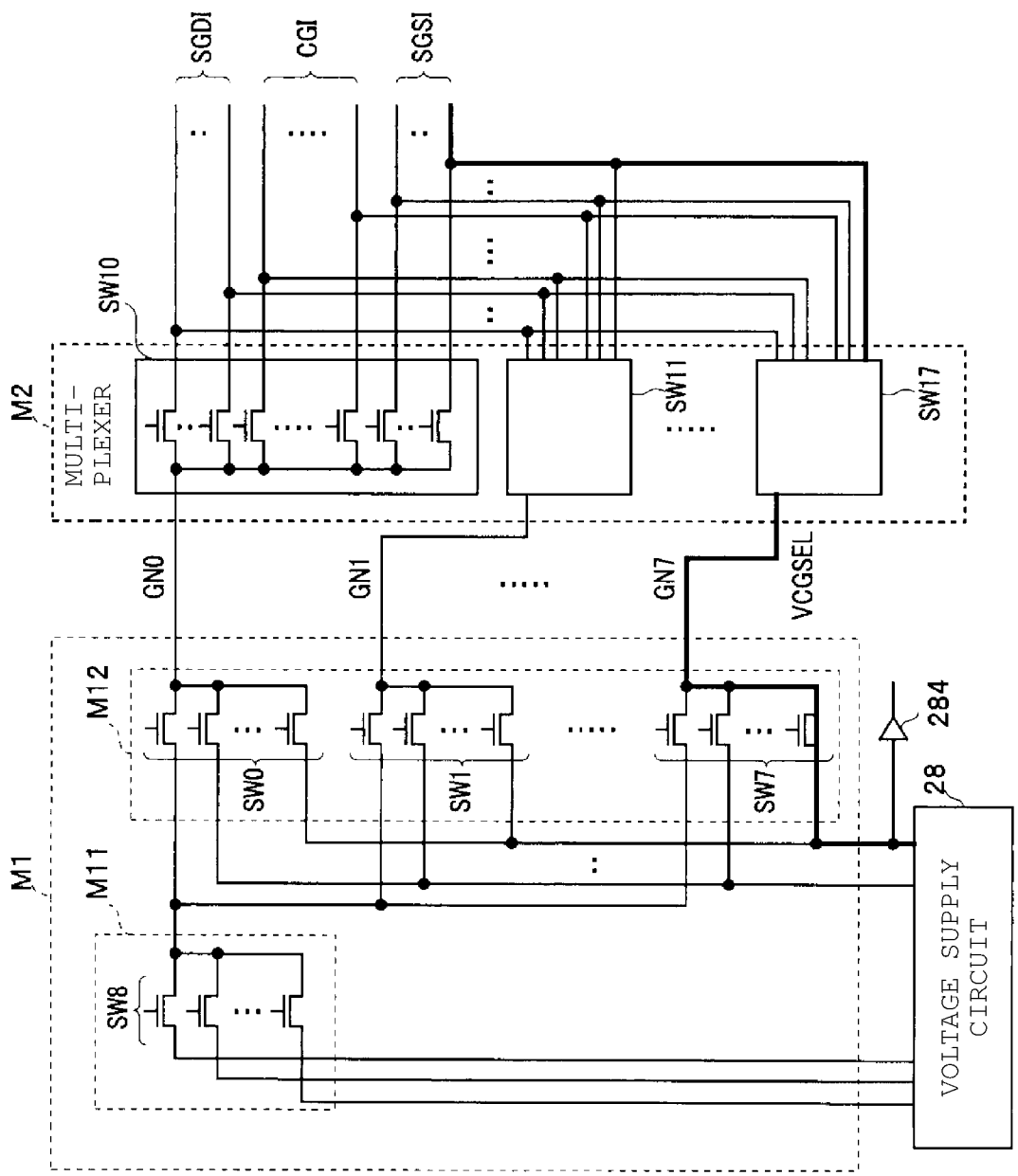
FIG. 22 is a diagram illustrating an example of detection of a voltage of a wiring through which a voltage is supplied to the select gate lines during the program operation.

FIG. 22 is a diagram illustrating an example of detecting a voltage of a wiring through which a voltage VCGSEL is supplied to the select gate lines SGS during the program period. In FIG. 22, the same components as those of FIG. 19 are represented by the same reference numerals, and the description thereof will not be repeated. A thick line in FIG. 22 indicates a supply path of the voltage VCGSEL. The voltage supply circuit 28 generates the voltage VCGSEL. The voltage VCGSEL is transmitted to the control signal line GN7, for example, through the switches in the switch group SW7, and is transmitted from the control signal line GN7 to each of the switches in the switch group SW17. The switches in the switch group SW17 supply the voltage VCGSEL to the control signal lines SGSI corresponding to the select gate lines SGS.

In this case, the comparator 284 compares the voltage at each of positions in the supply path of the voltage VCGSEL with a threshold voltage to detect negative swing. The output of the comparator 284 is supplied to the AND circuit 283 in FIG. 15. As a result, negative swing occurring at the end of the program period (voltage VPASS2 application period) illustrated in FIG. 9 can be detected. In this way, at the end of the program period, the occurrence of junction forward in the transistors TR of the row decoder 25 is prevented.

In this way, by detecting the negative swing of the control signal lines at the path from the voltage supply circuit 28 to the row decoder 25, the negative swing can be detected with the comparators 284 the number of which is less than the number of the control signal lines in the memory cell array 23.

(Other Circuit Examples where Control Signal Lines are Driven)

Figure 23:
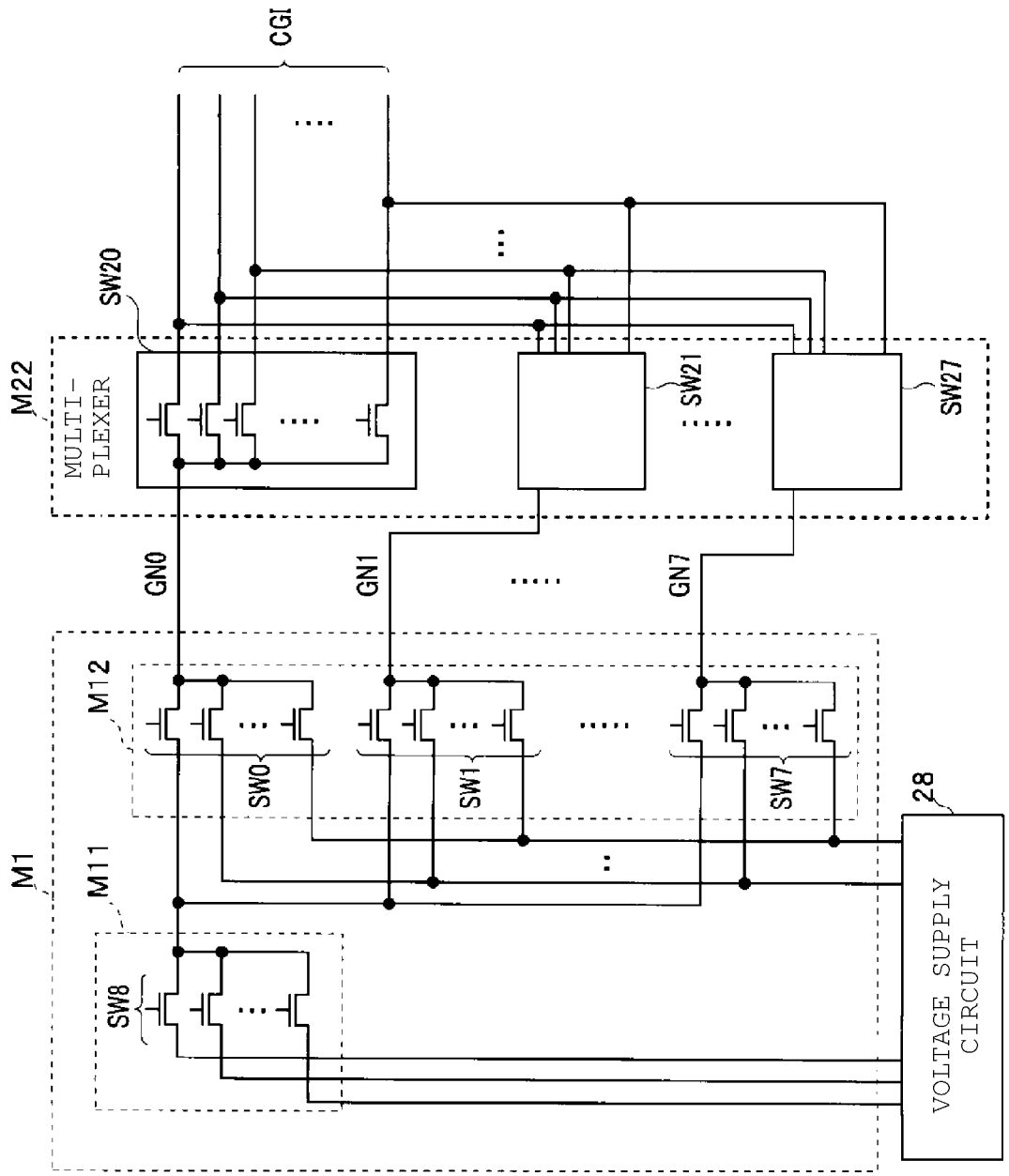
FIG. 23 is a diagram illustrating another example of the wiring path from the voltage supply circuit to the row decoder.
Figure 24:
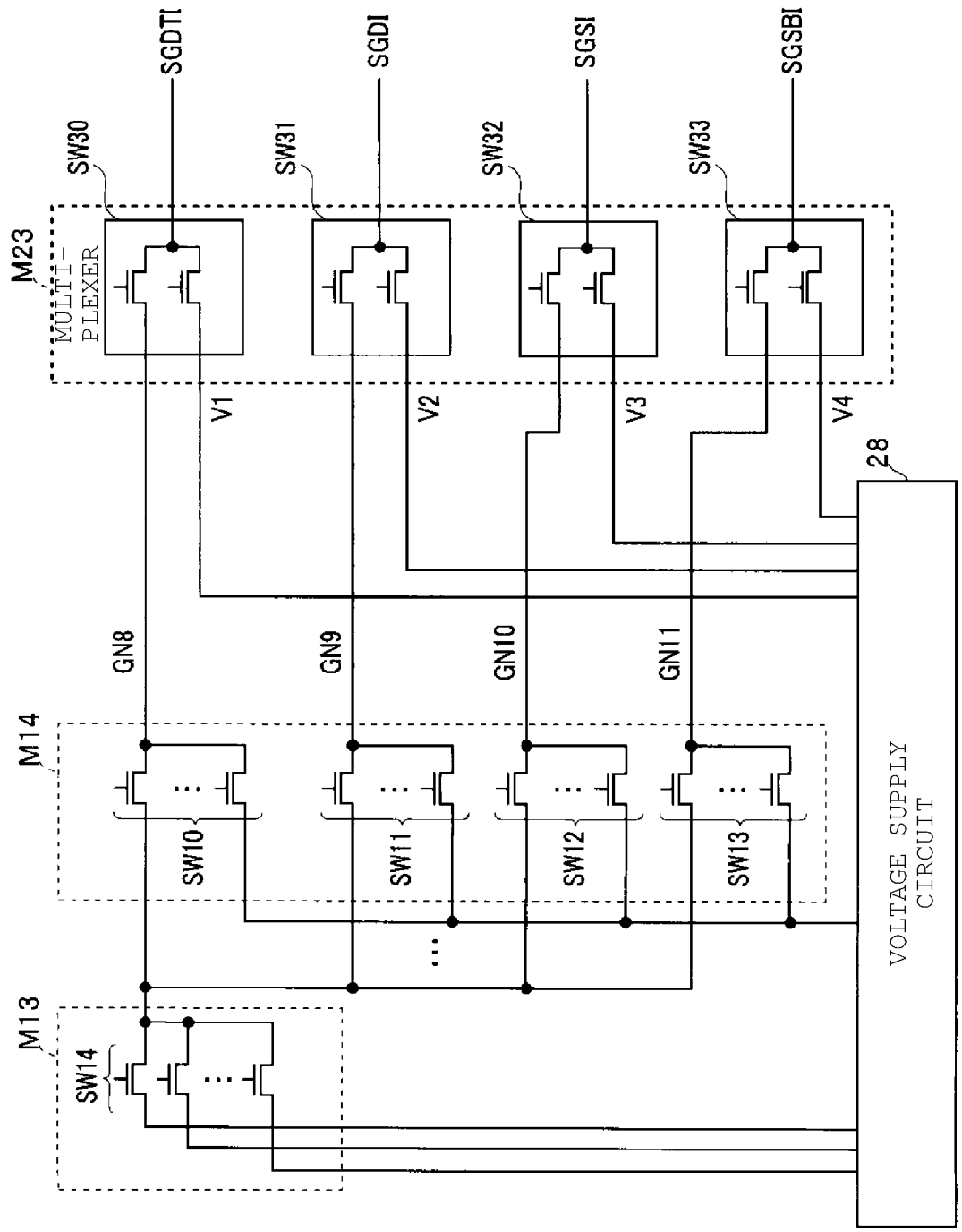
FIG. 24 is a diagram illustrating another example of the wiring path from the voltage supply circuit to the row decoder.

FIGS. 23 and 24 are diagrams illustrating another example of the wiring path from the voltage supply circuit 28 to the row decoder 25. In the example of FIG. 19, the control signal lines SGDI, SGSI, and CGI are driven by the common driver of the multiplexers M1 and M2. FIGS. 23 and 24 illustrate the example where the control signal lines CGI and the control signal lines SGDI and SGSI are driven by different drivers. In FIGS. 23 and 24, the same components as those of FIG. 19 are represented by the same reference numerals, and the description thereof will not be repeated.

FIG. 23 illustrates the circuit that drives the control signal lines CGI. FIG. 23 is different from FIG. 19 in that a multiplexer M22 is used instead of the multiplexer M2. The multiplexer M22 includes switch groups SW20 to SW27, each of which including a plurality of switches. The switch groups SW20 to SW27 have the same configuration. Input terminals of the switches in the switch group SW20 are connected in common to the control signal line GN0. Output terminals of the switches in the switch group SW20 are connected to the control signal lines CGI, respectively. The switch group SW20 determines which one of the control signal lines CGI is a control signal line CGI to which the voltage is supplied through the control signal line GN0. For example, when the read voltage VCGRV is transmitted through the control signal line GN0, each of the switches in the switch group SW20 is controlled such that the read voltage VCGRV is supplied to the control signal line CGI corresponding to the word line WL to be read.

Likewise, as illustrated in FIG. 23, input terminals of the switches in the switch groups SW20 to SW27 are connected to the control signal lines GN1 to GN7, respectively. In addition, as illustrated in FIG. 23, output terminals of the switch groups SW20 to SW27 are connected to the control signal lines CGI, respectively.

Each of the switches in the switch groups SW21 to SW27 is controlled such that the voltages transmitted through the control signal lines GN1 to GN7 are supplied to the control signal lines CGI corresponding to the control signal lines WL in the memory cell array 23 to which the voltages are to be supplied. In this way, the corresponding voltages are supplied from the multiplexer M22 to the control signal lines CGI. For example, during the write operation, each of the switches in the switch group where the voltage VPASS is transmitted through the control signal lines GN is controlled such that the voltage VPASS is supplied to a plurality of control signal lines CGI corresponding to the non-selected word lines WL_use1.

FIG. 24 illustrates a circuit that drives control signal lines SGDTI, SGDI, SGSI, and SGSBI. FIG. 24 is different from FIG. 19 in that multiplexers M13 and M14 are used instead of the multiplexer M1 and a multiplexer M23 is used instead of the multiplexer M2. The multiplexer M13 includes a switch group SW14 having a plurality of switches. The multiplexer M14 includes switch groups SW10 to SW13, each of which has a plurality of switches. The switch group SW14 is supplied with plural types of voltages from the voltage supply circuit 28, selects one type of voltage from the voltages, and the outputs the selected voltage to the switch groups SW10 to SW13. Not only the voltage supplied from the switch group SW14 but also plural types of voltages from the voltage supply circuit 28 are supplied to the switch groups SW10 to SW13. Each of the switch groups SW10 to SW13 selects one type of voltage from the supplied voltages, and the selected voltages are output to control signal lines GN8 to GN11, respectively.

The multiplexer M23 includes switch groups SW30 to SW33, each of which includes two switches. The switch groups SW30 to SW33 have the same configuration. In the switch group 30, an input terminal of one switch is connected to the control signal lines GN8, and a voltage V1 is supplied to an input terminal of another switch. Output terminals of the switches in the switch group SW30 are connected in common to the control signal line SGDTI. The switch group SW30 determines which one of the voltage supplied through the control signal line GN8 or the voltage V1 is supplied to the control signal line SGDTI.

Likewise, as illustrated in FIG. 24, in the switch groups SW31 to SW33, input terminals of one switches are connected to control signal lines GN9 to GN11, respectively, and voltages V2 to V4 are supplied to input terminals of other switches. In addition, as illustrated in FIG. 24, output terminals of the switch groups SW30 to SW33 are commonly connected to the control signal lines SGDI, SGSI, and SGSBI, respectively.

Each of the switches in the switch groups SW31 to SW33 is controlled such that the voltages transmitted through the control signal lines GN9 to GN11 are supplied to the control signal lines SGDTI, SGDI, SGSI, and SGSBI corresponding to the control signal lines SGDT, SGD, SGS, and SGSB in the memory cell array 23 to which the voltages are to be supplied. In this way, the corresponding voltages are supplied from the multiplexer M23 to the control signal lines SGDT, SGD, SGS, and SGSB. FIG. 19 illustrates the examples where two types of select gate lines are provided. On the other hand, FIG. 24 illustrates the example where four types of select gate lines are provided.

Third Embodiment

Figure 25:
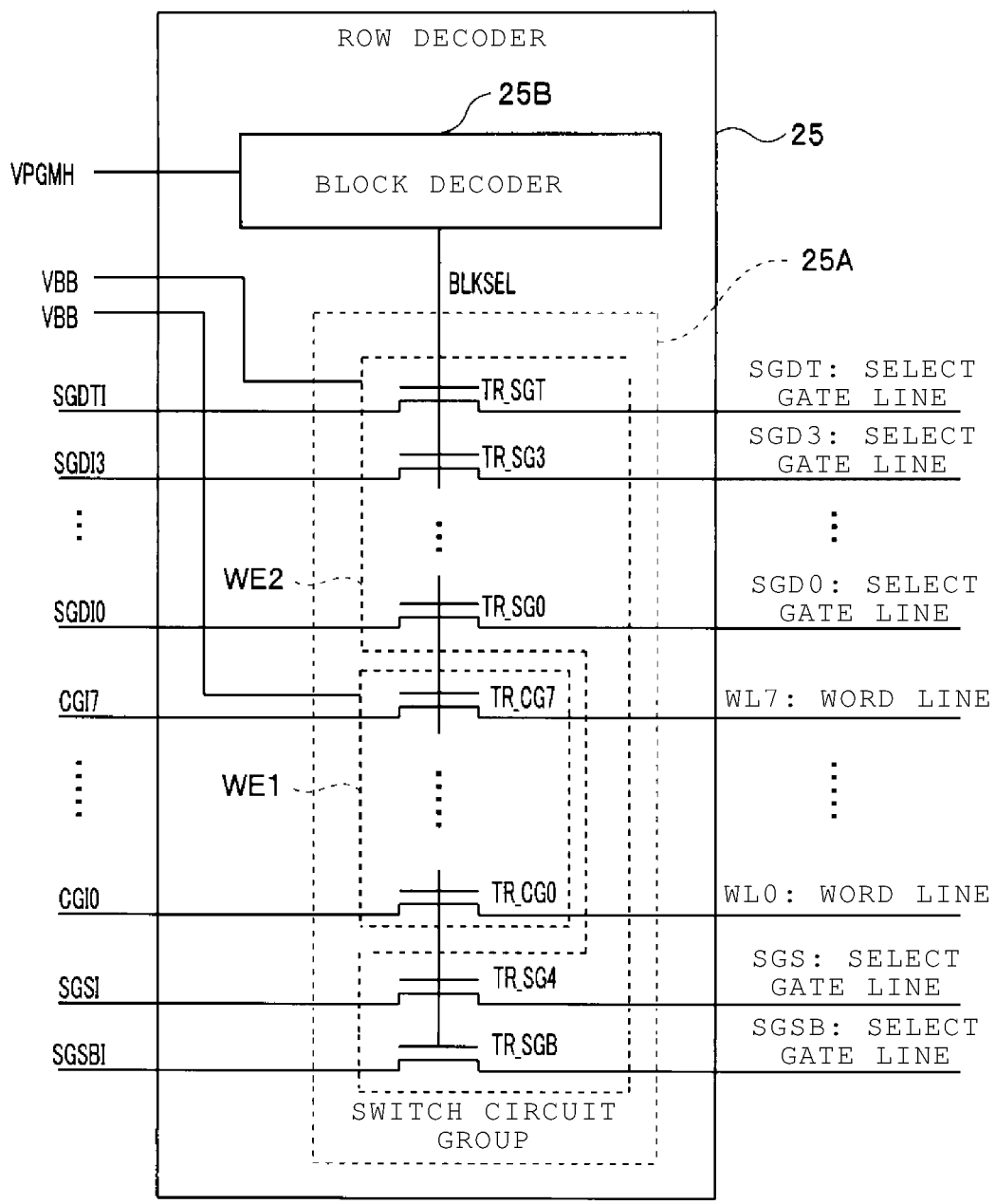
FIG. 25 is a diagram illustrating a row decoder in a third embodiment.

FIG. 25 is a diagram illustrating a row decoder 25 according to a third embodiment. In FIG. 25, the same components as those of FIG. 6 are represented by the same reference numerals, and the description thereof will not be repeated. FIG. 25 illustrates the example where the control signal line SGDTI that is connected to the select gate line SGDT through the transistor TR_SG3 is used as the control signal line SGDI3 of FIG. 6. In addition, although FIG. 6 illustrates only the single control signal line SGSI, FIG. 25 illustrates the example where not only the control signal line SGSI but also the control signal line SGSBI are used. The control signal line SGSBI is connected to the select gate line SGSB through a transistor TR_SGB.

In the present embodiment, the Pwells 73 of the transistors TR in the row decoder 25 are shared by the plurality of transistors and are divided into the Pwell 73 of the transistors TR connected to the word lines WL and the Pwell 73 of the transistors TR connected to the select gate lines SGD and SGS. Each of regions WE1 and WE2 surrounded by broken line frames in FIG. 25 is a region where the common Pwell 73 is shared. As illustrated in FIG. 25, the Pwell 73 of the plurality of transistors TR connected to the word lines WL is formed in the region WE1, and the Pwell 73 of the plurality of transistors TR connected to the select gate lines SGD and SGS is formed in the region WE2.

The set of transistors sharing the Pwell 73 is not limited to this example, and an appropriate combination may be adopted.

According to the above configuration, the application of the negative voltage VBB to the contact 77 of the Pwell 73 in the region WE1 and the application of the negative voltage VBB to the contact 77 of the Pwell 73 in the region WE2 can be controlled independently. That is, in the present embodiment, the negative voltage VBB can be supplied to the transistors TR connected to the word lines WL and the transistors TR connected to the select gate lines SGD and SGS under different start conditions. The start condition of the application of the negative voltage VBB to the Pwell 73 in the region WE1 is set based on the voltage of the word lines WL or the control signal line CGI. The start condition of the application of the negative voltage VBB to the Pwell 73 in the region WE2 is set based on the voltage of the select gate lines SGD, SGDT, SGS, and SGSB or the control signal lines SGDI, SGDTI, SGSI, and SGSBI.

Figure 26:
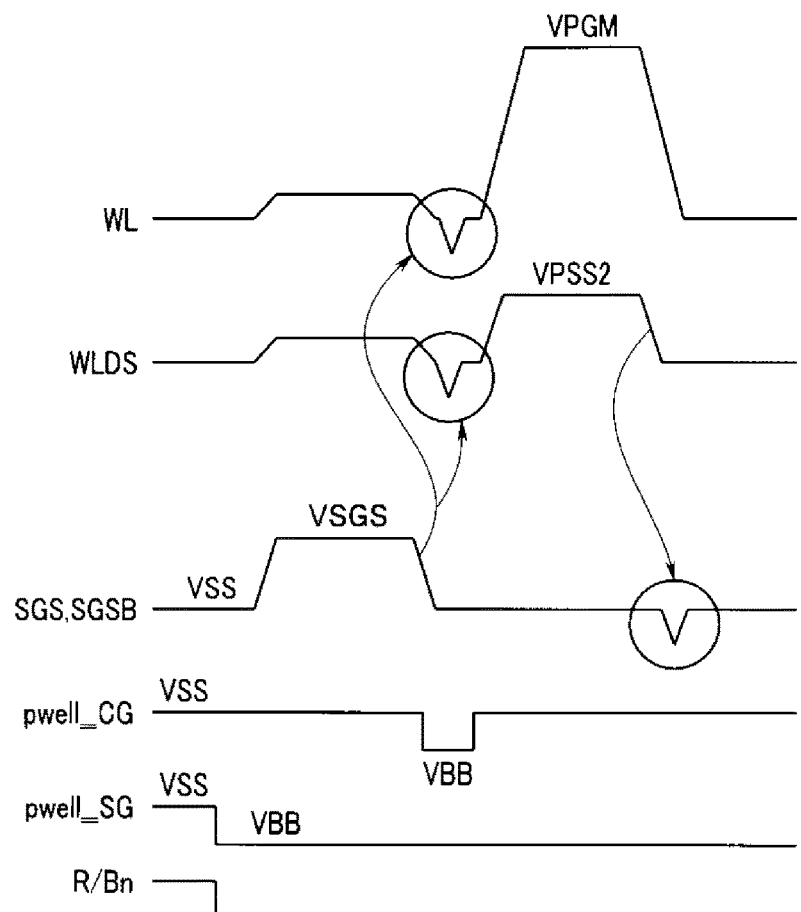
FIG. 26 is a diagram illustrating an example of applying different voltages to contacts of transistors of two regions in the example of FIG. 25.
Figure 27:
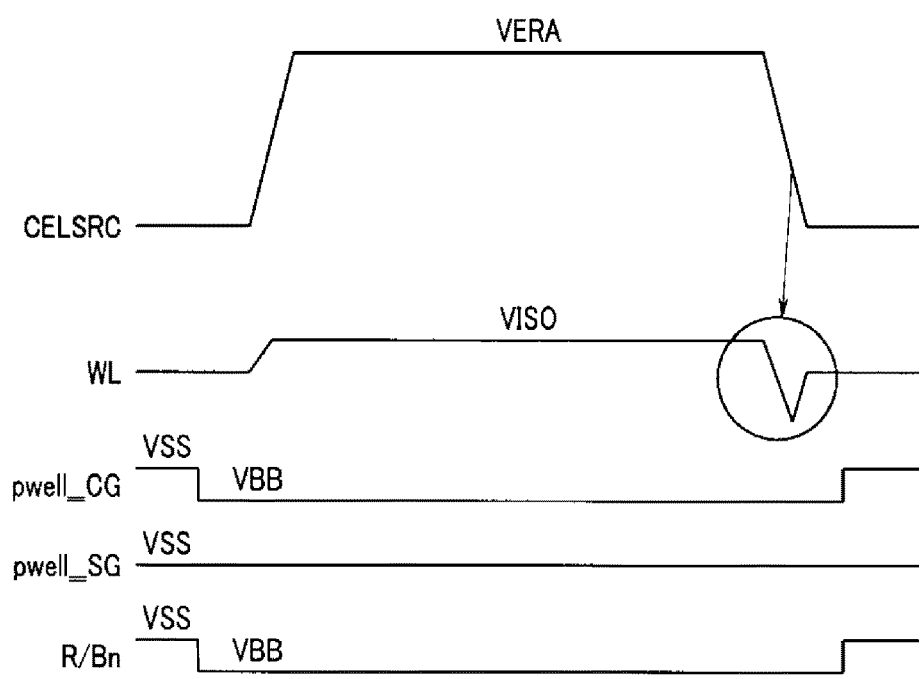
FIG. 27 is a diagram illustrating the example of applying different voltages to contacts of transistors of the two regions in the example of FIG. 25.

FIGS. 26 and 27 are diagrams illustrating examples of applying different voltages to contacts 77 of the transistors TR of the regions WE1 and WE2 in the configuration shown in FIG. 25. FIG. 26 illustrates an example of the channel pre-charge period and the program period of FIG. 9, and FIG. 27 illustrates an example of the erasing operation period of FIG. 11.

In general, when all of the transistors in the switch circuit group 25A are formed in one Pwell 73, during the write operation, there may be a case where a period when a relatively high voltage (for example, the program voltage VPGM) is applied to the selected word line WL does not satisfy the start condition of the application of the negative voltage VBB to the Pwell 73. In this case, when the end of the voltage VPASS2 application period overlaps a program voltage VPGM application period, the application of the negative voltage VBB for preventing negative swing is not executed.

In the present embodiment, as illustrated in FIG. 26, for example, to the Pwell 73 of the region WE1, unlike the example of FIG. 14A, the negative voltage VBB is not supplied at the end of the program period (i.e., the voltage VPASS2 application period), and the negative voltage VBB is supplied at the end of the channel pre-charge period (i.e., pwell_CG in FIG. 26). At the end of the channel pre-charge period, the possibility of negative swing in the word lines WL or the dummy word lines WLDS is high. Therefore, the occurrence of junction forward can be reduced depending on the application of the negative voltage VBB to the Pwell 73 of the region WE1.

On the other hand, in the Pwell 73 of the region WE2, for example, in the transistors TR connected to the select gate lines SGS, as indicated by pwell_SG in FIG. 26, the negative voltage VBB is applied when the signal R/B is busy after a write operation command is received, and the supply of the negative voltage VBB is stopped when the signal R/B is ready. At the end of the voltage VPASS2 application period, the possibility of negative swing in the select gate lines SGS and SGSB is high. Therefore, the occurrence of junction forward can be reduced depending on the application of the negative voltage VBB to the Pwell 73 of the region WE2. During the write operation, a high voltage is not applied to the select gate lines SGS and SGSB. Therefore, even when the negative voltage VBB is constantly applied to the Pwell 73 of the region WE2 during the write operation period, there is no problem.

During the write operation according to the present embodiment, even when the end of the voltage VPASS2 application period overlaps a program voltage VPGM application period, the application of the negative voltage VBB for preventing negative swing can be executed.

In addition, when all of the transistors in the switch circuit group 25A are formed in one Pwell 73, during the erasing operation, there may be a case where a period when a relatively high voltage (for example, the erase voltage VERA) is applied to the source line CELSRC does not satisfy the start condition of the application of the negative voltage VBB to the Pwell 73. In this case, the recovery rate of the erase voltage VERA is high. when the voltage changes from the erase voltage VERA to the power supply voltage VSS within a short period of time, the application of the negative voltage VBB for preventing negative swing is not executed.

In the present embodiment, unlike the example of FIG. 14B, in the Pwell 73 of the region WE1, as indicated by pwell_CG in FIG. 27, the negative voltage VBB is controlled to be applied when the signal R/B is busy after the write operation command is received, and the supply of the negative voltage VBB is controlled to be stopped when the signal R/B is ready. At the end of the erasing voltage operation period, the possibility of negative swing in the word lines WL is high. Therefore, the occurrence of junction forward can be reduced depending on the application of the negative voltage VBB to the Pwell 73 of the region WE1. During the erasing operation, a high voltage is not applied to the word lines WL. Therefore, even when the negative voltage VBB is constantly applied to the Pwell 73 of the region WE1 during the erasing operation period, there is no problem.

On the other hand, the possibility of negative swing in the select gate lines SGD, SGDT, SGS, and SGSB is low. Therefore, at the end of the erasing operation period, the negative voltage VBB is not supplied, and the power supply voltage VSS is supplied (pwell_SG in FIG. 27).

During the erasing operation according to the present embodiment, when the recovery rate of the erase voltage VERA is high, the application of the negative voltage VBB for preventing negative swing can be executed.

In this way, in the present embodiment, the Pwell is shared by each type of control signal lines, and the transistors to which the negative voltage is supplied is controlled for each Pwell. As a result, the start condition for generating the negative voltage VBB can change depending on the sets of the Pwells, and the reliability of the operation of the row decoder can be further improved.

When the second embodiment is combined with the third embodiment, the negative voltage VBB is applied to the Pwell 73 of the region WE1, for example, by detecting negative swing in the word lines WL, the dummy word lines WLDS, or the control signal lines CGI and GN during the write operation.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
 a memory string including a first select transistor, a plurality of memory cell transistors, and a second select transistor connected in series;
 a voltage supply circuit configured to generate a plurality of operation voltages to operate the semiconductor memory device, the operation voltages including a negative voltage;
 a plurality of control signal lines connected between the voltage supply circuit and the memory string, the plurality of control signal lines including a word line connected to a gate of one of the memory transistors;
 a row decoder including a plurality of transistors provided in the plurality of control signal lines, respectively; and
 a control circuit configured to control the transistors of the row decoder and cause the negative voltage to be supplied to the row decoder during a certain period of time in which a voltage of one of the control signal lines drops to a negative level, the certain period of time including a first period of time during which a voltage of the word line drops to a negative level.

2. The semiconductor memory device according to claim 1, wherein
 the row decoder includes a semiconductor substrate, a first well of a first semiconductor type formed in the semiconductor substrate, and a second well of a second semiconductor type formed in the first well, the plurality of transistors being formed with the second well, and the negative voltage is supplied to the second well of the row decoder.

3. The semiconductor memory device according to claim 1, wherein the first period of time is at an end of a channel pre-charge period prior to a program period to program data in the memory string.

4. The semiconductor memory device according to claim 1, wherein the transistors of the row decoder includes a first group of transistors connected to the memory cell transistors and a second group of transistors connected to the first and second select transistors, the row decoder includes a semiconductor substrate, a first well of a first semiconductor type formed in the semiconductor substrate, a second well of a second semiconductor type formed in the first well, and a third well of the semiconductor type formed in the first well separately from the second well, the first group of transistors being formed with the second well, the second group of transistors being formed with the third well, and the negative voltage is supplied to the second well of the row decoder.

5. A semiconductor memory device comprising:

a memory string including a first select transistor, a plurality of memory cell transistors, and a second select transistor connected in series;

a voltage supply circuit configured to generate a plurality of operation voltages to operate the semiconductor memory device, the operation voltages including a negative voltage;

a plurality of control signal lines connected between the voltage supply circuit and the memory string; the plurality of control signal lines including a select gate line connected to a gate of the second select transistor;

a row decoder including a plurality of transistors provided in the plurality of control signal lines, respectively; and a control circuit configured to control the transistors of the row decoder and cause the negative voltage to be supplied to the row decoder during a period of time during which a voltage of the select gate line drops to a negative level.

6. The semiconductor memory device according to claim 5, wherein the period of time is at and end of a program period to program data in the memory string.

7. The semiconductor memory device according to claim 5, wherein the transistors of the row decoder includes a first group of transistors connected to the memory cell transistors and a second group of transistors connected to the first and second select transistors, the row decoder includes a semiconductor substrate, a first well of a first semiconductor type formed in the semiconductor substrate, a second well of a second semiconductor type formed in the first well, and a third well of the semiconductor type formed in the first well separately from the second well, the first group of transistors being formed with the second well, the second group of transistors being formed with the third well, and the negative voltage is supplied to the third well of the row decoder.

8. The semiconductor memory device according to claim 1, wherein the certain period of time includes a second period of time during which a voltage of the word line drops to a negative level at end of an erase period to erase data from the memory string.

9. The semiconductor memory device according to claim 8, wherein the transistors of the row decoder includes a first group of transistors connected to the memory cell transistors and a second group of transistors connected to the first and second select transistors, the row decoder includes a semiconductor substrate, a first well of a first semiconductor type formed in the semiconductor substrate, a second well of a second semiconductor type formed in the first well, and a third well of the semiconductor type formed in the first well separately from the second well, the first group of transistors being formed with the second well, the second group of transistors being formed with the third well, and the negative voltage is supplied to the second well of the row decoder.

10. The semiconductor memory device according to claim 1, wherein the control circuit is further configured to cause the negative voltage to be supplied to one or more of the control signal lines for reading data from the memory string.

11. The semiconductor memory device according to claim 1, further comprising:

a detection circuit configured to detect a voltage of one of the control signal lines dropping to a negative level, wherein the control circuit is configured to cause the negative voltage to be supplied to the row decoder upon the detection by the detection circuit.

12. The semiconductor memory device according to claim 11, wherein the control circuit is configured to cause the negative voltage to be supplied to the row decoder for a predetermined period of time while the detection circuit is detecting the voltage of the one of the control signal lines being negative.

13. The semiconductor memory device according to claim 11, wherein the control circuit is configured to cause the negative voltage to be supplied to the row decoder for a predetermined period of time after the detection by the detection circuit.

14. The semiconductor memory device according to claim 11, further comprising:

a multiplexer provided in a signal path of the control signal lines from the voltage supply circuit to the row decoder, wherein the detection circuit is provided in a signal path of one of the control signal lines from the voltage supply circuit to the multiplexer.

15. A semiconductor memory device comprising:

a memory string;

a voltage supply circuit configured to generate a plurality of operation voltages to operate the semiconductor memory device, the operation voltages including a negative voltage;

a plurality of control signal lines connected between the voltage supply circuit and the memory string;

a row decoder including a plurality of transistors provided in the plurality of control signal lines, respectively;

a detection circuit configured to detect a voltage of one of the control signal lines dropping to a negative level; and a control circuit configured to cause the negative voltage to be supplied to the row decoder upon the detection by the detection circuit.

16. The semiconductor memory device according to claim 15, wherein the row decoder includes a semiconductor substrate, a first well of a first semiconductor type formed in the semiconductor substrate, and a second well of a second semiconductor type formed in the first well, the plurality of transistors being formed with the second well, and the negative voltage is supplied to the second well of the row decoder.

17. The semiconductor memory device according to claim 15, wherein the control circuit is configured to cause the negative voltage to be supplied to the row decoder for a predetermined period of time while the detection circuit is detecting the voltage of the one of the control signal lines being negative.

18. The semiconductor memory device according to claim 15, further comprising:

a multiplexer provided in a signal path of the control signal lines from the voltage supply circuit to the row decoder, wherein the detection circuit is provided in a signal path of one of the control signal lines from the voltage supply circuit to the multiplexer.

19. The semiconductor memory device according to claim 15, further comprising:

first and second multiplexers provided in this order in a signal path of the control signal lines from the voltage supply circuit to the row decoder, wherein the detection circuit is provided in a signal path of one of the control signal lines from the voltage supply circuit to the first multiplexer.

20. The semiconductor memory device according to claim 15, further comprising:

first and second multiplexers provided in this order in a signal path of the control signal lines from the voltage supply circuit to the row decoder, wherein the detection circuit is provided in a signal path of one of the control signal lines between the first and second multiplexers.

* * * * *